US008923003B2

(12) United States Patent
Schlaupitz et al.

(10) Patent No.: US 8,923,003 B2
(45) Date of Patent: Dec. 30, 2014

(54) FLEXIBLE CIRCUIT CONNECTORS WITH REDUCED PROFILES

(75) Inventors: Alexander D. Schlaupitz, Santa Clara, CA (US); Joshua G. Wurzel, Sunnyvale, CA (US)

(73) Assignee: Apple Inc., Cupertino, CA (US)

( * ) Notice: Subject to any disclaimer, the term of this patent is extended or adjusted under 35 U.S.C. 154(b) by 180 days.

(21) Appl. No.: 13/367,131

(22) Filed: Feb. 6, 2012

(65) Prior Publication Data

US 2013/0201620 A1 Aug. 8, 2013

(51) Int. Cl.

| | |
|---|---|
| ***H05K 1/14*** | (2006.01) |
| ***H05K 1/00*** | (2006.01) |
| ***H05K 1/18*** | (2006.01) |
| ***H05K 7/00*** | (2006.01) |
| ***H05K 5/00*** | (2006.01) |
| ***H05K 1/16*** | (2006.01) |
| ***H05K 7/10*** | (2006.01) |
| ***H05K 7/12*** | (2006.01) |
| ***H01R 9/00*** | (2006.01) |
| ***H05K 1/11*** | (2006.01) |
| ***H05K 7/14*** | (2006.01) |
| ***H05K 7/18*** | (2006.01) |
| ***H01R 29/00*** | (2006.01) |
| ***H02B 1/056*** | (2006.01) |
| ***H01R 12/00*** | (2006.01) |
| ***H01R 13/40*** | (2006.01) |

(52) U.S. Cl.

USPC ........... 361/749; 361/736; 361/739; 361/741; 361/743; 361/748; 361/750; 361/751; 361/752; 361/753; 361/754; 361/755; 361/756; 361/757; 361/758; 361/759; 361/760; 361/761; 361/762; 361/763; 361/764; 361/765; 361/766; 361/767; 361/768; 361/769; 361/770; 361/771; 361/772; 361/773; 361/774; 361/775; 361/776; 361/777; 361/778; 361/779; 361/780; 361/781; 361/782; 361/783; 361/784; 361/785; 361/786; 361/787; 361/788; 361/789; 361/790; 361/791; 361/792; 361/793; 361/794; 361/795; 361/796; 361/797; 361/798; 361/799; 361/800; 361/801; 361/802; 361/803; 361/804; 439/44; 439/67; 439/591

(58) Field of Classification Search

USPC ................. 361/749, 736–745, 750–804, 748; 439/44, 67, 591

See application file for complete search history.

(56) References Cited

U.S. PATENT DOCUMENTS 3,629,787 A * 12/1971 Wilson ............................ 439/67
4,695,258 A * 9/1987 Hanson et al. .................. 439/67
4,850,883 A * 7/1989 Kabadi ........................... 439/67

(Continued)

*Primary Examiner* — Anthony Haughton
*Assistant Examiner* — Zhengfu Feng
(74) *Attorney, Agent, or Firm* — Treyz Law Group; Kendall P. Woodruff

(57) ABSTRACT

An electronic device may contain components such as flexible printed circuits and rigid printed circuits. Electrical contact pads on a flexible printed circuit may be coupled electrical contact pads on a rigid printed circuit using a coupling member. The coupling member may be configured to electrically couple contact pads on a top surface of the flexible circuit to contact pads on a top surface of the rigid circuit. The coupling member may be configured to bear against a top surface of the flexible circuit so that pads on a bottom surface of the flexible circuit rest against pads on a top surface of the rigid circuit. The coupling member may bear against the top surface of the flexible circuit. The coupling member may include protrusions that extend into openings in the rigid printed circuit. The protrusions may be engaged with engagement members in the openings.

22 Claims, 36 Drawing Sheets

(56) References Cited

U.S. PATENT DOCUMENTS

| | | | | |
|---|---|---|---|---|
| 5,920,465 | A * | 7/1999 | Tanaka | 361/784 |
| 6,093,054 | A | 7/2000 | Merkle et al. | |
| 6,690,185 | B1 * | 2/2004 | Khandros et al. | 324/756.03 |
| 6,785,144 | B1 | 8/2004 | Akram | |
| 6,835,071 | B2 * | 12/2004 | Pupkiewicz et al. | 439/66 |
| 7,292,459 | B2 * | 11/2007 | Wang | 361/818 |
| 7,371,978 | B2 | 5/2008 | Flummer et al. | |
| 7,405,867 | B2 | 7/2008 | Park et al. | |
| 7,525,816 | B2 * | 4/2009 | Sawachi | 361/792 |
| 2004/0018767 | A1 * | 1/2004 | Buck et al. | 439/329 |
| 2005/0041404 | A1 * | 2/2005 | Cady et al. | 361/749 |
| 2006/0067066 | A1 * | 3/2006 | Meier et al. | 361/785 |
| 2007/0134473 | A1 * | 6/2007 | Kim | 428/209 |
| 2010/0099276 | A1 * | 4/2010 | Capeleto et al. | 439/65 |

* cited by examiner

FLEXIBLE CIRCUIT CONNECTORS WITH REDUCED PROFILES

BACKGROUND

This relates generally to electronic devices, and more particularly, to electronic devices having flexible circuitry.

Electronic devices often include components such as displays that are coupled to printed circuit boards by an interposing flexible printed circuit.

A flexible printed circuit is often coupled to a printed circuit board using a flex-to-board connector attached to an end of the flexible printed circuit. A flex-to-board connector can be as thick as several millimeters. Tolerances in device design must include space for these connectors. This can be problematic for compact electronic devices.

In some situations, an anisotropic conductive film is interposed between a flexible printed circuit and a printed circuit board. However, electrical connections formed using anisotropic conductive film are often undesirable for providing sufficient current for powering components such as displays.

It would therefore be desirable to be able to provide improved ways to control the operation of electronic devices with displays.

SUMMARY

An electronic device may have circuitry such a printed circuit boards and flexible printed circuits. A printed circuit board may be a rigid printed circuit board. A rigid printed circuit board may be electrically coupled to flexible circuitry that carries electrical signals from the printed circuit board to other electronic device components such as a display.

The flexible circuitry may include a flexible printed circuit (flex-circuit) or other flexible circuitry. A display may include a thin-film-transistor (TFT) layer that is coupled to the printed circuit board with the flexible circuitry.

The flexible circuitry may be electrically coupled to additional circuitry in the electronic device. The additional circuitry may include, as examples, a printed circuit board, a rigid layer of a display (e.g., a thin-film-transistor glass layer), a rigid-flex circuit, or another flexible circuit such as a flexible printed circuit. The flexible circuitry may be electrically coupled to the additional circuitry using electrical contacts (sometimes referred to herein as electrical contact pads, contact pads, or pads) that contact electrical contacts on the additional circuitry. The electrical contacts on the flexible circuitry may be coupled to the contacts on the additional circuitry using a coupling member.

A coupling member may include a rigid conductive coupling member that is electrically coupled between the contacts on the flexible circuitry and the contacts on the additional circuitry. The coupling member may be formed from conductive portions and non-conductive portions or may be substantially all conductive. Non-conductive portions may be formed from insulating material that is overmolded onto conductive portions of the coupling member or the coupling member may be formed having conductive and non-conductive portions using a two-shot molding process or other process.

If desired, a coupling member may include solder that couples electrical contacts on a top side of the flexible circuitry to electrical contacts on a top side of the additional circuitry that is in physical contact with a bottom side of the flexible circuitry.

A coupling member may include protrusions such as bumps that provide a contact force against a top side of the flexible circuitry in order to hold electrical contacts on a bottom side of the flexible circuit in physical contact with contacts on the top side of the additional circuitry. If desired, solder may be provided between the contacts on the bottom side of the flexible circuit and contacts on the top side of the additional circuitry.

The coupling member may be attached to the additional circuitry using a suitable conductive material such as solder or using a conductive weld. If desired, the coupling member may be attached to the additional circuitry using one or more protrusions that extend into associated openings in the additional circuitry such as openings in a printed circuit board. The coupling member may include a conductive connection to a ground contact on the additional circuitry. The ground contact may be formed on a surface of the additional circuitry or in an opening in the additional circuitry.

Protruding portions on the coupling member may engage the openings in the additional circuitry. The protrusions may be non-conductive protrusions or may be formed from conductive material that is attached to a ground contact in the additional circuitry.

If desired, openings in the additional circuitry may extend from a first (e.g., top) surface through to a second (e.g., bottom) surface of the additional circuitry. Protrusions on the coupling member may be attached to an engagement member in the openings. Engagement members may include screws or other fasteners, clips, mating recesses, grooves, and other engagement features, glue, welds, or other suitable attachment mechanisms.

If desired, a conductive coupling member may be soldered to electrical contacts in the openings. A conductive coupling member that is soldered to electrical contacts in the openings may include a recess. The electrical contacts on the flexible circuit may be soldered to a surface of the recess in the conductive coupling member.

During manufacturing, the coupling member may first be attached to the additional circuitry by welding, soldering, attaching to an engagement member in an opening, etc. Following attachment of the coupling member to the additional circuitry, the flexible circuit may be inserted into a space between the coupling member and the additional circuitry. Following insertion of the flexible circuitry, electrical contacts on the flexible circuitry may be pressed against electrical contacts on the additional circuitry, may be soldered to electrical contacts on the additional circuitry, may be soldered to the coupling member, or may be or otherwise electrically coupled to electrical contacts on the additional circuitry using the coupling member.

The coupling member may be provided with solder paste that is reflowed into contact with the electrical contacts on the flexible circuit using, for example, a heat bar. The heat bar may also provide pressure that helps attach the flexible circuit to the additional circuitry.

If desired, the flexible printed circuit may be inserted into an opening in the additional circuitry and attached to the additional circuitry by wicking solder into the opening.

Further features of the invention, its nature and various advantages will be more apparent from the accompanying drawings and the following detailed description of the preferred embodiments.

DETAILED DESCRIPTION

Electronic devices may include flexible circuitry such as flexible printed circuits and additional circuitry such as printed circuit boards. A flexible printed circuit may be coupled to the additional circuitry using a coupling member. The coupling member may help reduce the thickness of the connection between the flexible circuitry and the additional circuitry, thereby reducing the overall thickness of the electronic device. Flexible circuitry may, for example, include a flexible printed circuit substrate. The flexible printed circuit substrate may be coupled to additional circuitry such as a printed circuit board, a rigid layer of a display, another flexible printed circuit substrate or other additional circuitry. As an example, the flexible printed circuit substrate may be coupled between a printed circuit board and an electronic component such as a display. Displays may be used to display visual information such as text and images to users.

Illustrative electronic devices that may be provided with displays are shown in FIGS. 1, 2, 3 and 4.

Figure 1:
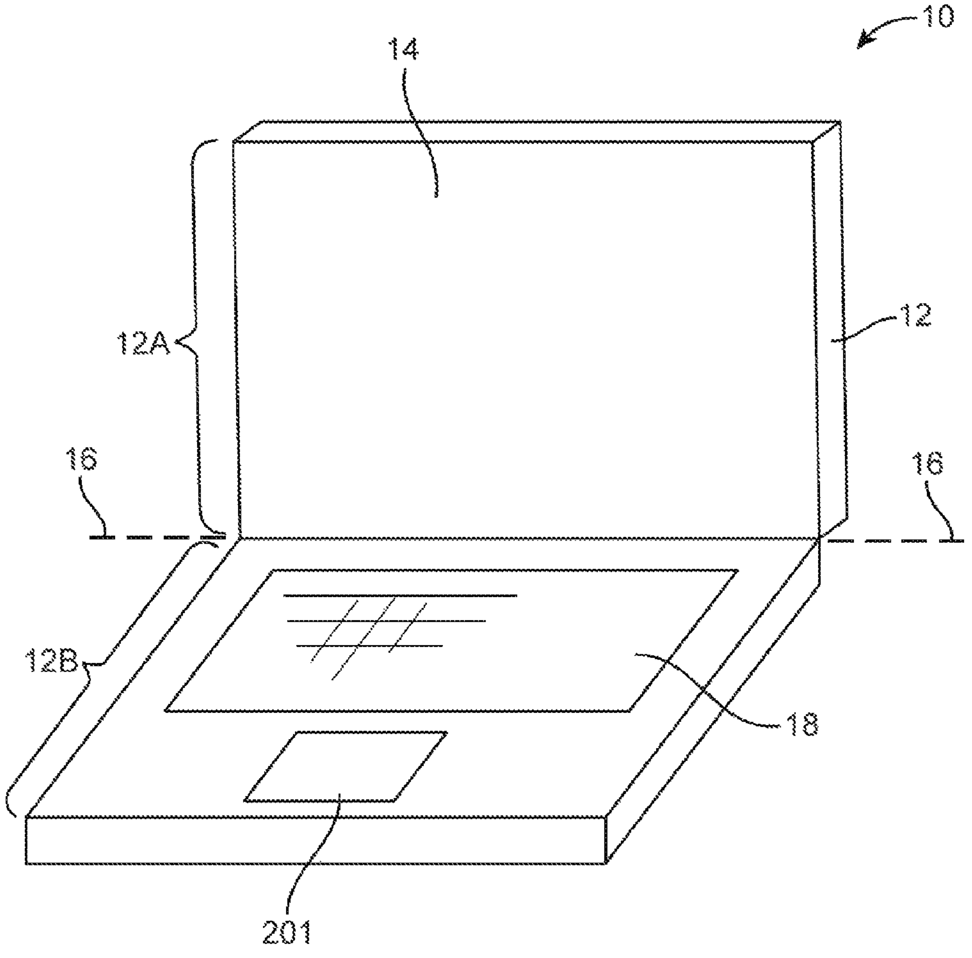
FIG. 1 is a diagram of an illustrative electronic device with flexible circuitry coupled to a printed circuit board using a coupling member such as a portable computer in accordance with an embodiment of the present invention.

An illustrative electronic device of the type that may be provided with a coupling member that attaches flexible circuitry to additional circuitry such as a printed circuit board is shown in FIG. 1. Electronic device 10 may be a computer such as a computer that is integrated into a display such as a computer monitor, a laptop computer, a tablet computer, a somewhat smaller portable device such as a wrist-watch device, pendant device, or other wearable or miniature device, a cellular telephone, a media player, a tablet computer, a gaming device, a navigation device, a computer monitor, a television, or other electronic equipment.

As shown in FIG. 1, device 10 may include a display such as display 14. Display 14 may be a touch screen that incorporates capacitive touch electrodes or other touch sensor components or may be a display that is not touch sensitive. Display 14 may include image pixels formed from liquid crystal display (LCD) components or other suitable display pixel structures. Arrangements in which display 14 is formed using liquid crystal display pixels are sometimes described herein as an example. This is, however, merely illustrative. Any suitable type of display technology may be used in forming display 14 if desired.

Device 10 may have a housing such as housing 12. Housing 12, which may sometimes be referred to as a case, may be formed of plastic, glass, ceramics, fiber composites, metal (e.g., stainless steel, aluminum, etc.), other suitable materials, or a combination of any two or more of these materials.

Housing 12 may be formed using a unibody configuration in which some or all of housing 12 is machined or molded as a single structure or may be formed using multiple structures (e.g., an internal frame structure, one or more structures that form exterior housing surfaces, etc.).

As shown in FIG. 1, housing 12 may have multiple parts. For example, housing 12 may have upper portion 12A and lower portion 12B. Upper portion 12A may be coupled to lower portion 12B using a hinge that allows portion 12A to rotate about rotational axis 16 relative to portion 12B. A keyboard such as keyboard 18 and a touch pad such as touch pad 201 may be mounted in housing portion 12B.

Figure 2:
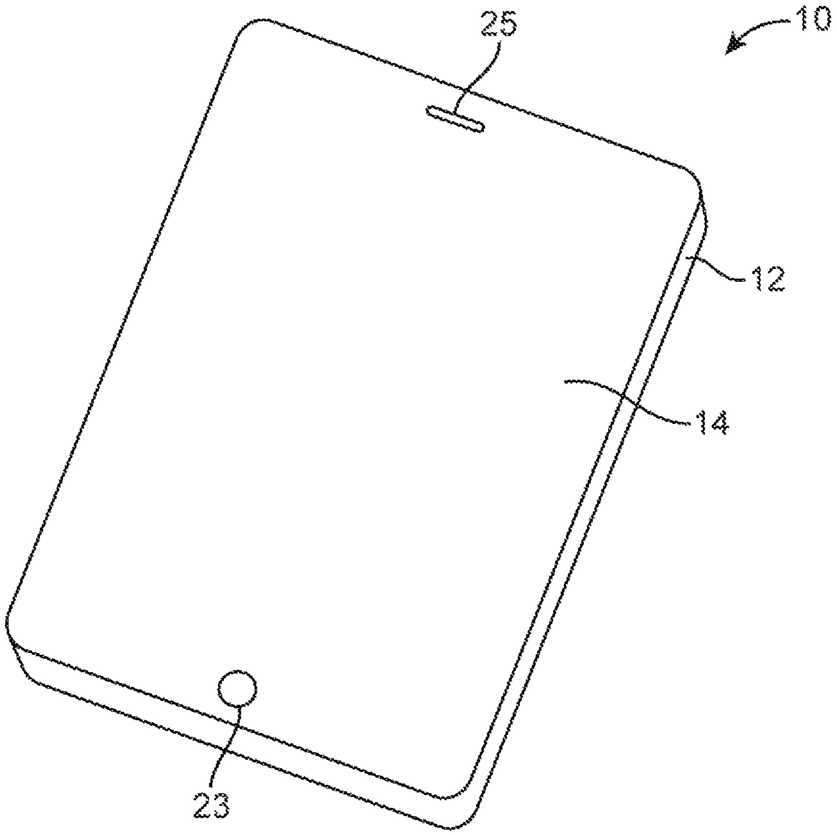
FIG. 2 is a diagram of an illustrative electronic device with flexible circuitry coupled to a printed circuit board using a coupling member such as a cellular telephone or other handheld device in accordance with an embodiment of the present invention.

In the example of FIG. 2, device 10 has been implemented using a housing that is sufficiently small to fit within a user's hand (i.e., device 10 of FIG. 2 may be a handheld electronic device such as a cellular telephone). As show in FIG. 2, device 10 may include a display such as display 14 mounted on the front of housing 12. Display 14 may be substantially filled with active display pixels or may have an active portion and an inactive portion. Display 14 may have openings (e.g., openings in the inactive or active portions of display 14) such as an opening to accommodate button 23 and an opening to accommodate speaker port 25.

Figure 3:
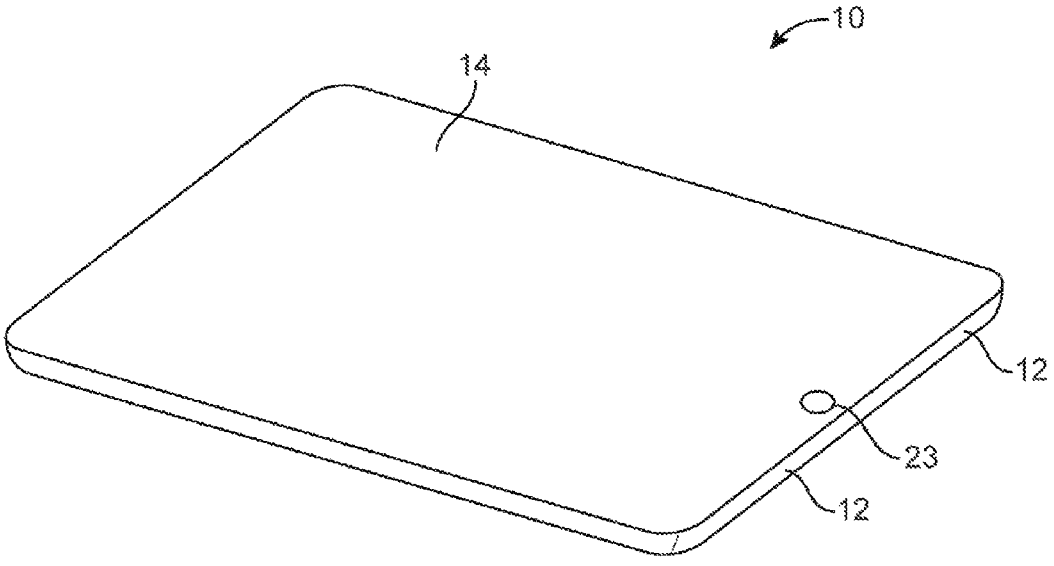
FIG. 3 is a diagram of an illustrative electronic device with flexible circuitry coupled to a printed circuit board using a coupling member such as a tablet computer in accordance with an embodiment of the present invention.

FIG. 3 is a perspective view of electronic device 10 in a configuration in which electronic device 10 has been implemented in the form of a tablet computer. As shown in FIG. 3, display 14 may be mounted on the upper (front) surface of housing 12. An opening may be formed in display 14 to accommodate button 22.

Figure 4:
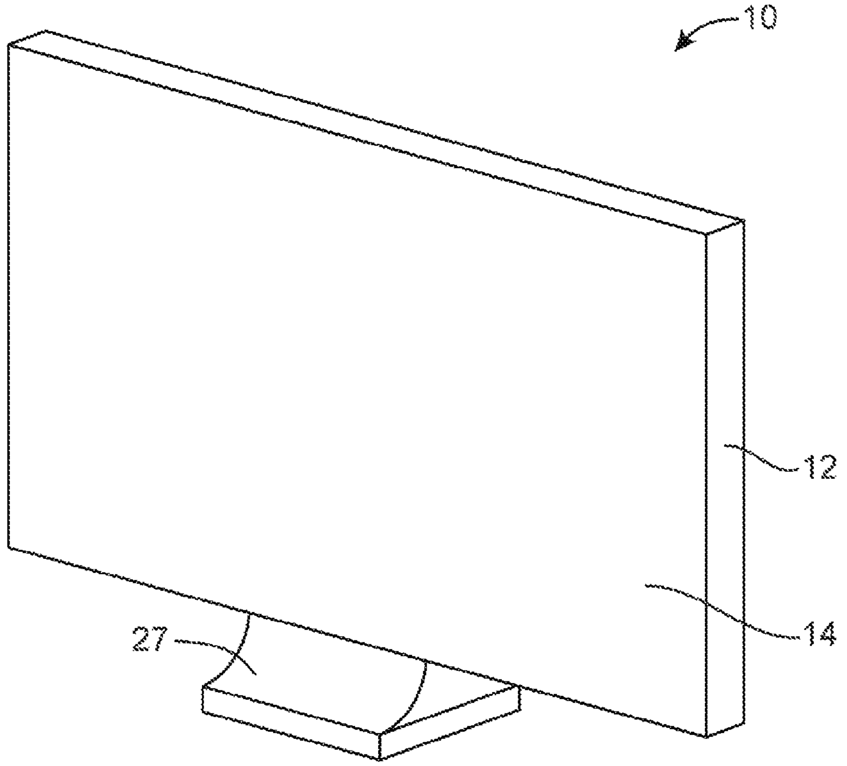
FIG. 4 is a diagram of an illustrative electronic device with flexible circuitry coupled to a printed circuit board using a coupling member such as a computer monitor with a built-in computer in accordance with an embodiment of the present invention.

FIG. 4 is a perspective view of electronic device 10 in a configuration in which electronic device 10 has been implemented in the form of a computer integrated into a computer monitor. As shown in FIG. 4, display 14 may be mounted on the front surface of housing 12. Stand 27 may be used to support housing 12.

Display 14 may include an array of display pixels. Each display pixel may be used to control the light intensity associated with a portion of the display.

Figure 5:
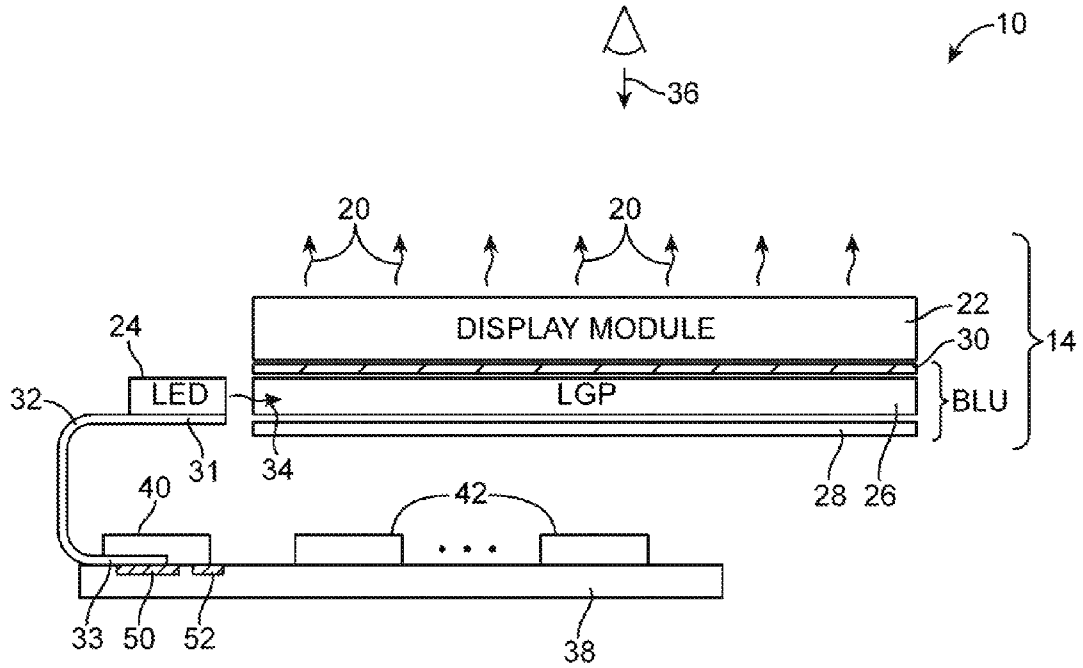
FIG. 5 is a cross-sectional side view of circuitry in an electronic device such as a display and a printed circuit board that are coupled using a flexible printed circuit and a coupling member in accordance with an embodiment of the present invention.

A cross-sectional side view of an illustrative configuration that may be used for display 14 of device 10 (e.g., device 10 of FIG. 1, FIG. 2, FIG. 3, or FIG. 4 or other suitable electronic devices) is shown in FIG. 5. As shown in FIG. 5, display 14 may include backlight structures such as backlight unit BLU for producing backlight 20. During operation, backlight 20 travels outwards (vertically upwards in the orientation of FIG. 5) and passes through image pixel structures in display module 22. This illuminates any images that are being produced by the pixels of display module 22 for viewing by a user of device 10. Display module 22 may be, for example, a liquid crystal display (LCD) module. Other display technologies may be used for display 14 if desired. The use of LCD technology is merely illustrative.

Backlight unit BLU may have a chassis (not shown) with an interior shape that receives components such as light-emitting diodes 24, light guide plate (LGP) 26, and reflector 28. Optical films 30 such as a diffuser layer and other films may be mounted over light guide plate 26. Light guide plate 26 may be formed from a layer of clear material such as a sheet of acrylic, polycarbonate, or other polymer. Reflector 28 may be formed from a reflective substance such as white polyester or a high-low dielectric stack.

Light-emitting diodes 24 may be attached to substrate 31. Substrate 31 may be a flexible printed circuit substrate ("flex circuit") such as a sheet of polyimide or other flexible dielectric. During operation, light from light-emitting diodes 24 may be emitted in direction 34 and may be guided within light guide plate 26 by total internal reflection. Some of this light may escape upwards and may serve as backlight 20 for display 14. Reflector 28 may reflect any light that escapes plate 26 in the downwards direction up through display module 22 to add to the strength of backlight 20. Liquid crystal display module 22 may have upper and lower polarizers, a thin-film transistor layer, a color filter layer, and a layer of liquid crystal material that is interposed between the color filter layer and thin-film transistor layer (as an example). As backlight 20 travels through module 22, a user may view a backlit image from direction 36.

Substrate 31 may contain conductive traces (e.g., metal lines) that route signals between light-emitting diodes 24 and circuitry elsewhere in device 10. With one suitable arrangement, substrate 31 is coupled to a main printed circuit board using a flexible printed circuit. In the example of FIG. 5, flexible circuitry 32 is coupled between display 14 and additional circuitry 38 (e.g., a rigid printed circuit board) using coupling member 40. Flexible circuitry 32 may be an extended portion of substrate 31 or flexible circuitry 32 may be a separate flexible printed circuit that is attached to substrate 31 (e.g., using a connector, using solder, etc.).

Arrangements in which flexible circuitry 32 is coupled to a printed circuit board using coupling member 40 are sometimes discussed herein as examples. However, this is merely illustrative. A coupling member such as coupling member 40 may be used to couple flexible circuitry 32 to any additional circuitry 38 (e.g., a rigid printed circuit board, a display layer, a battery, an additional flexible printed circuit, or any other suitable circuit substrate having electrical contacts for coupling to a flexible printed circuit).

Circuitry for device 10 may be mounted on printed circuit boards such as board 38 and/or may be coupled to the circuitry on printed circuit board 38 through additional signal lines (e.g., signal lines on additional flex circuits, signal lines on additional rigid printed circuit boards, etc). This circuitry may include, for example, components 42.

Components 42 may include control circuitry such as control circuitry based on one or more processing integrated circuits (e.g., microprocessors) and storage (e.g., volatile and non-volatile memory). Components 42 may include communications circuits such as integrated circuits for communicating over serial buses and parallel buses with internal components and external equipment that is connected to device 10 by a cable and a connector in device 10 and/or internal circuits in device 10.

Discrete components may be mounted on board 38 with other components. Examples of discrete components are inductors, capacitors, and resistors. Other components 42 that may be mounted on board 38 or elsewhere in device 10 include switches, connectors, cameras, camera flash circuits (e.g., light-emitting diodes or other light sources that serve as a camera flash), and audio circuits.

Components 42 may include video chips such as one or more display driver integrated circuits for displaying images on display 14 and a video driver integrated circuit or circuits for driving video signals onto a monitor or other external display that is coupled to device 10. Accessory interface circuitry such as circuitry that is associated with an external component that is controlled by device 10 and/or that provides input to device 10 and other circuits and devices may also be included in components 42 if desired.

Portion 33 of flexible printed circuit substrate (flexible circuit) 32 may be electrically coupled to conductive contacts such as contact 50 of additional circuitry (e.g., printed circuit board) 38. PCB 38 may include conductive traces that couple contacts such as contact 50 to additional components such as components 42.

Coupling member 40 may be an electrical coupling member that includes conductive portions coupled between contacts (not shown) on portion 33 of flexible circuit 32 and contacts such as contact 50 of PCB 38. Additional portions of coupling member 40 may be electrically coupled to a ground contact such as ground contact 52 on PCB 38. If desired, coupling member 40 may be configured to exert a force on portion 33 of flexible circuit 32 that holds conductive contacts on portion 33 of flexible circuitry 32 in contact with contacts 50 of PCB 38.

Coupling member 40 may include solder that couples electrical contacts on a top side of flexible circuit 32 to electrical contacts 50 on a top side of printed circuit board 38.

Coupling member 40 may be formed from conductive portions and non-conductive portions or may be substantially all conductive. Non-conductive portions may be formed from insulating material that is overmolded onto conductive portions of coupling member 40, coupling member 40 may be formed having conductive and non-conductive portions using a two-shot molding process, or conductive and non-conductive portions may be formed separately and joined together using a manual or automated assembly process involving, as examples, ultrasonically welding, swaging, gluing, or otherwise attaching non-conductive and conductive portions to form coupling member 40.

Coupling member 40 may include protrusions such as bumps that provide a contact force that holds contacts on a bottom side of flexible circuit 32 in physical contact with contacts 50 on the top side of the printed circuit board 38. If desired, solder may be provided between contacts on the bottom side of flexible circuit 32 and contacts 50 on the top side of printed circuit board 38.

Coupling member 40 may be attached to additional circuitry 38 using a suitable conductive material (e.g., solder, etc.) or using a conductive weld. If desired, coupling member 40 may be attached to PCB 38 using one or more engagement members in an opening in printed circuit board 38. Coupling member 40 may include a conductive connection to ground contact 52 on printed circuit board 38. The conductive connection to ground contact 52 may be formed using a surface connection (e.g., by soldering member 40 to the top surface of PCB 38) or using a protruding portion of coupling member 40 that extends into an opening in the printed circuit board.

Coupling member 40 may include protruding portions that engage an engagement member in openings in printed circuit board 38 or that are soldered to contacts in openings in PCB 38. Protrusions may be non-conductive protrusions or may be formed from conductive material that is coupled to a ground contact in the printed circuit board.

If desired, coupling member 40 may include a recess in printed circuit board 38 that is configured to mate with portion 33 of flexible circuit 32. Portion 33 of flexible circuit 32 may include a recess that is configured to mate with the recess in PCB 38.

Figure 6:
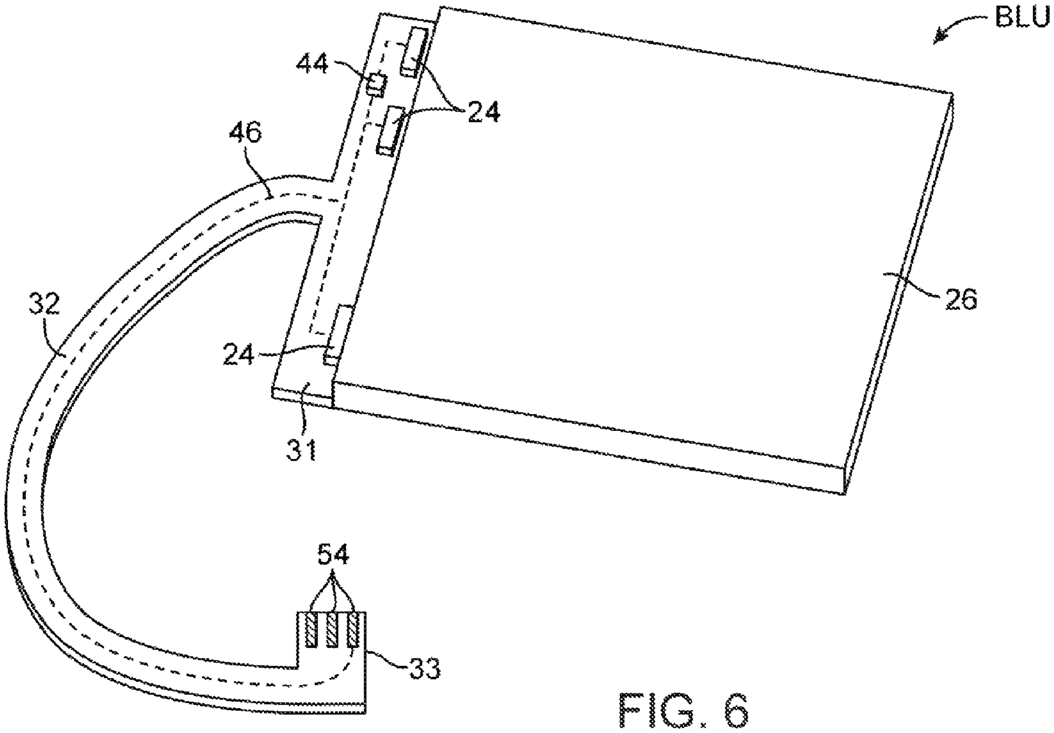
FIG. 6 is a perspective view of an illustrative backlight module that includes an array of light-emitting diodes, an associated light guide plate, and flexible circuitry having electrical contacts in accordance with an embodiment of the present invention.

Flexible circuit 32 may be an extended portion of a substrate (e.g., substrate 31) that forms a portion of an electronic device component such as a device display as shown in FIG. 6.

FIG. 6 is a perspective view of the structures in backlight unit BLU, showing how additional circuitry 44 may, if desired, be mounted to the top surface of flex circuit substrate 31 (i.e., the same side of flex circuit substrate 31 to which light-emitting diodes 24 are mounted). Conductive traces 46 in flexible circuitry 32 may be used to route drive power to light-emitting diodes 24 from PCB 38. If desired, components such as components 44 may be mounted in other locations of device 10. The mounting arrangements of FIGS. 5 and 6 are merely illustrative.

Portion 33 of flexible circuit 32 may include conductive contacts such as contacts 54. Coupling member 40 (see, e.g., FIG. 5) may be configured to form an electrical bridge between contacts 54 of portion 33 and contacts 50 of PCB 38. However, this is merely illustrative. Coupling member 40 may be configured to apply pressure to portion 33 of flexible circuit 32 in order to hold contacts 54 in physical contact (for example) with contacts 50 of PCB 38. Conductive traces 46 in flexible circuitry 32 may be used to route drive power to light-emitting diodes 24 from conductive pads 54 that are coupled to conductive pads 50 of PCB 38 using coupling member 40.

The examples of FIGS. 5 and 6 in which flexible circuitry 32 is coupled between a display such as display 14 and a printed circuit board such as printed circuit board 38 are merely illustrative. If desired, flexible circuitry 32 may be coupled to any suitable additional circuit using a coupling member such as coupling member 40. As another example, flexible circuitry 32 may be coupled between a rigid printed circuit board and a battery (e.g., a battery flex). Flexible circuitry that is coupled between a rigid printed circuit board and a battery may be coupled to the rigid printed circuit board and/or the battery using a coupling member such as coupling member 40.

Figure 7:
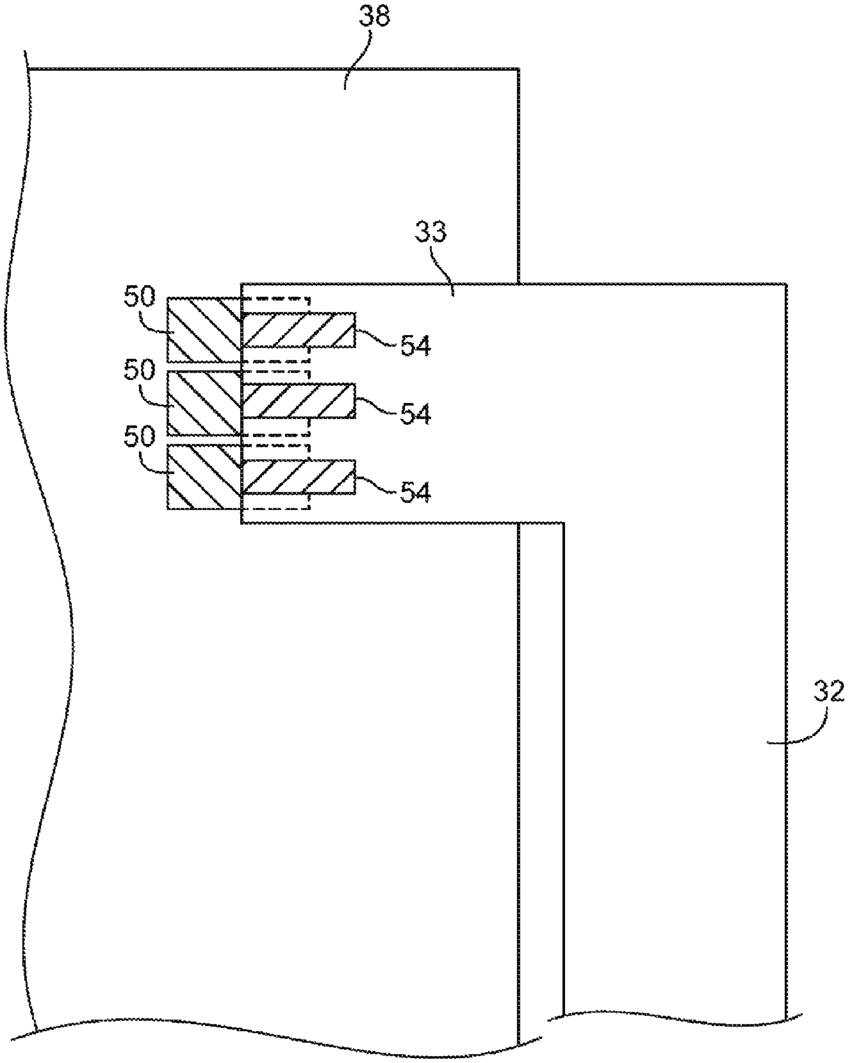
FIG. 7 is a top view of a portion of an illustrative printed circuit board and associated flexible circuit that may be coupled with a coupling member in accordance with an embodiment of the present invention.

FIG. 7 is a top view of a portion of PCB 38 in the vicinity of contacts 50. As shown in FIG. 7, portion 33 may extend over a portion of PCB 38 so that contacts 54 on portion 33 are aligned with contacts 50 of PCB 38. Contacts 54 of flexible circuit 32 may be located on an upper surface of flexible circuit 32, on a lower surface of flexible circuit 32 or may extend from a surface of portion 33 into one or more layers of flexible circuit 32. In general, flexible circuit 32 may include an insulating layer, such as a coverlay on opposing upper and lower surfaces of the flexible circuit. The insulating layer may be removed from portions of either the upper or lower surface in regions (e.g., region 33) in which it is desired to provide access to electrical contacts such as contacts 54.

For clarity of illustration, coupling member 40 is not shown in FIG. 7, however, coupling member 40 (see, e.g., FIG. 5) may be electrically coupled between contacts 50 and contacts 54. In configurations in which contacts 54 of flexible circuit 32 are formed on a bottom side of flexible circuit 32, a coupling member 40 may be used to provide a force on flexible circuit 32 that holds contacts 54 in physical contact with contacts 50 of PCB 38.

Figure 8:
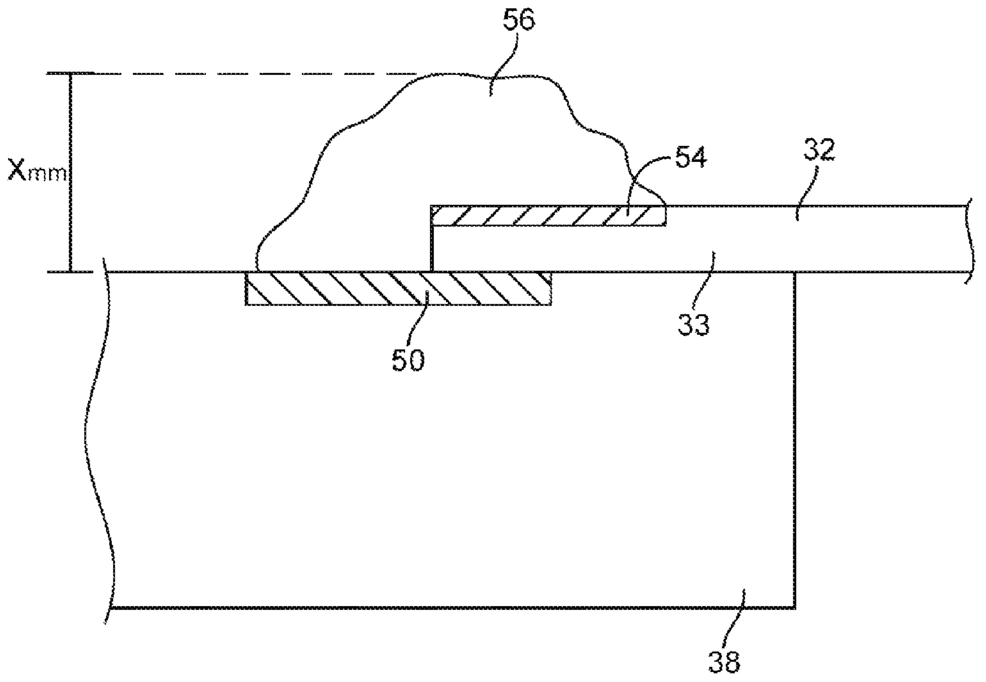
FIG. 8 is a cross-sectional side view of an illustrative flexible circuit attached to a printed circuit board using solder in accordance with an embodiment of the present invention.

If desired, contacts 54 of flexible circuit 32 may be electrically coupled to contacts 50 of PCB 38 using solder that is applied over contacts 54 and contacts 50 as shown in the cross-sectional side view of FIG. 8. Solder 56 may be applied by hand by a technician during assembly of device 10. Solder 56 that is applied by hand may form a structure having a thickness of X millimeters (mm) as shown in FIG. 8. For example, solder structure 56 may have a thickness X of less than 1 mm. Solder structures having a thickness of less than 1 mm may help reduce the thickness of a manufacturing margin for attaching flexible circuit 32 to PCB 38 during manufacturing of device 10. However, solder structures 56 that are applied by a technician may have variable thicknesses X of up to 0.4 mm or more. The thickness of the connection between flexible circuit 32 and PCB 38 may be further reduced using a preformed coupling member.

Figure 9:
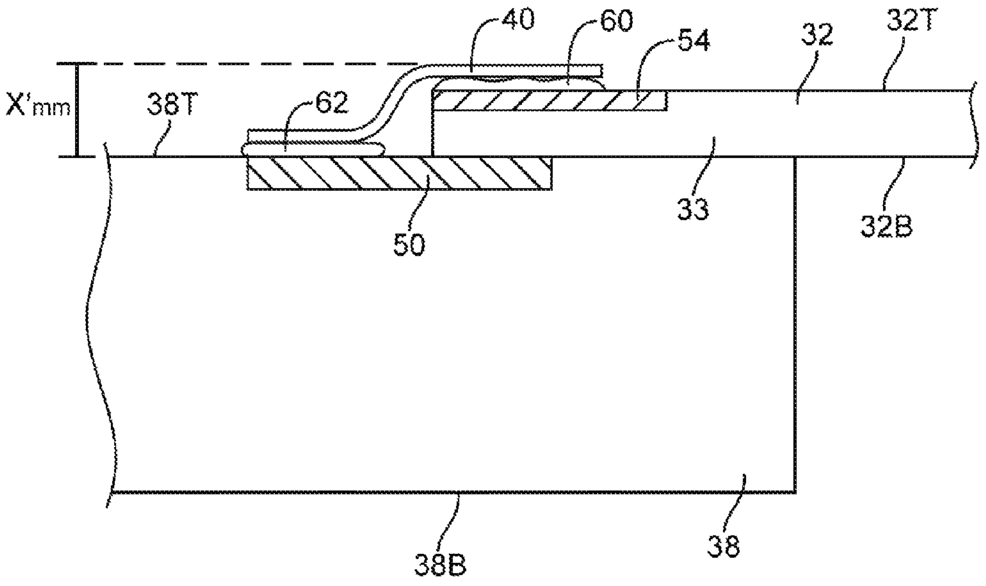
FIG. 9 is a cross-sectional side view of an illustrative flexible circuit attached to a printed circuit board using a conductive coupling member in accordance with an embodiment of the present invention.

FIG. 9 is a cross-sectional side view of a flexible circuit such as flexible circuit 32 coupled to a printed circuit board such as PCB 38 using a preformed coupling member such as coupling member 40. As shown in FIG. 9, coupling member 40 may be attached to electrical contacts such as contact 50 of PCB 38 using a conductive adhesive material such as solder 62. Coupling member 40 may have a curved shape that allows coupling member 40 to form a conductive bridge between contact 54 of flexible circuit 32 and contacts 50 of PCB 38 using an adhesive material such as solder 60.

PCB 38 may have opposing first and second surfaces. Contacts 50 may be formed on the first surface (e.g., top surface 38T). Flexible circuit 32 may have opposing first and second surface. In the example of FIG. 9, contacts 54 of flexible circuit 32 are formed on the first surface (e.g., top surface 32T) and the opposing second surface (e.g., bottom surface 32B) rests against the first surface of PCB 38. However, this is merely illustrative. If desired, contacts 54 may be formed on bottom surface 32B of flexible circuitry 32 and may be pressed into contact with contacts 50 on top surface 38T of PCB 38 using coupling member 40.

If desired, solder 62 may be configured to remain solid at a temperature that is higher than the reflow temperature of solder 60. In this way, solder 60 may be reflowed at a temperature that allows solder 62 to remain attached to PCB 38. Providing device 10 with solder 60 having a reflow temperature that is less than the reflow temperature of solder 62 may allow coupling member 40 to be attached to PCB 38 and flexible circuit 32 to be later inserted into the space between coupling member 40 and PCB 38 and attached to coupling member 40 using solder 60.

Alternatively, if desired, solder 60 may be configured to remain solid at a temperature that is higher than the reflow temperature of solder 62. In this way, solder 62 may be reflowed at a temperature that allows solder 60 to remain attached to flexible circuit 32. Providing device 10 with solder 62 having a reflow temperature that is less than the reflow temperature of solder 60 may allow coupling member 40 to be attached to flexible circuit 32 and to be later attached to PCB 38 using solder 62 (e.g., by applying a hot bar that has been heated to a temperature that is greater than the reflow temperature of solder 62 and less than the reflow temperature of solder 60 to coupling member 40). However, this is merely illustrative. If desired, solder 60 may have a reflow temperature that is substantially the same as the reflow temperature of solder 60. In configurations in which solder 60 and solder 62 have the same reflow temperature, coupling member 40 may be attached to both PCB 38 and flexible circuitry 32 using a single heat bar at a single temperature.

Coupling member 40 may have a curved shape that results in a thickness X' mm of the connection of flexible circuit 32 to PCB 38 that is less than thickness X mm of a hand soldered connection as shown in FIG. 8. For example, thickness X' may be 0.15-0.5 mm, 0.25-0.3 mm, less than 0.3 mm, more than 0.2 mm, etc.

Coupling member 40 may be formed from a material that is substantially all conductive (e.g., a metal strip formed from copper, aluminum, an alloy or other conductive material) or, if desired, coupling member 40 may have one or more conductive (metal) portions and one or more non-conductive portions (i.e., insulating portions) interposed between the conductive portions.

Figure 10:
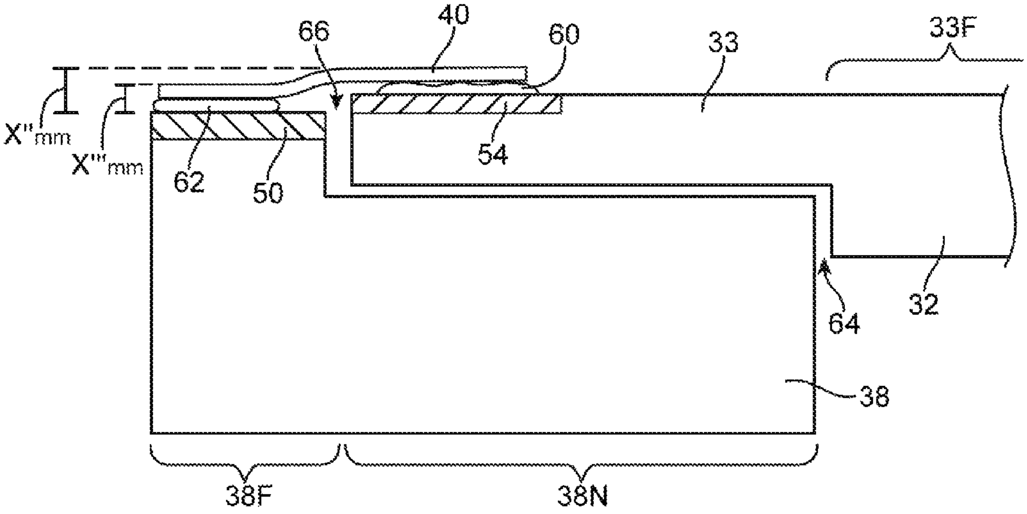
FIG. 10 is a cross-sectional side view of an illustrative flexible circuit seated in a recess in a printed circuit board and coupled to the printed circuit board using a conductive coupling member in accordance with an embodiment of the present invention.

As shown in FIG. 10, PCB 38 may be provided with a recess such as notch 66 in the vicinity of contacts such as contact 50. If desired, flexible circuit 32 may be provided with a recess such as notch 64. Notch 66 may be formed in PCB 38 by removing a portion of PCB 38 (e.g., by etching, grinding, drilling or otherwise removing a portion of PCB 38) or notch 66 may be a portion of PCB 38 in which fewer layers of PCB 38 have been stacked (e.g., portion 38N of PCB 38 may be a 3-layer PCB while portion 38F of PCB 38 may be a 4-layer PCB).

Notch 64 may be formed in flexible circuit 32 by removing a portion of flexible circuit 32 (e.g., by etching, grinding, drilling or otherwise removing a portion of flexible circuit 32) or notch 64 may be a portion of flexible circuit 32 in which fewer layers of flexible circuit 32 have been stacked (e.g., portion 33F of flexible circuit 32 may be a 3-layer flex circuit while portion 33 of flexible circuit 32 may be a 2-layer flex circuit).

Providing PCB 38 with a recess 66 that receives flexible circuit 32 (and, if desired, providing flexible circuit 32 with a recess 64 that mates with recess 66) may result in a thickness X" mm for the connection of flexible circuit 32 to PCB 38 that is less than thickness X' mm of FIG. 9. For example, thickness X" mm may be 0.05-0.15 mm, 0.0-0.25 mm, less than 0.25 mm, more than 0.25 mm, etc. If desired, recesses 66 and 64 may be configured so that portion 32 of flexible circuit 32 and the top surface of PCB 38 lie in a single common plane. If desired, notches 64 and 66 may be configured so that the surface of contacts 54 are mounted below the top surface of PCB 38 on which contacts 50 are formed (e.g., the thickness of flexible circuit 32 may be less than the depth of notch 66). In this configuration, the thickness of the connection between flexible circuit 32 and PCB 38 may be reduced to the thickness X"' mm that is equal to the thickness of coupling member 40 and the thickness of any interposed connecting material (e.g., solder 62).

Figure 11:
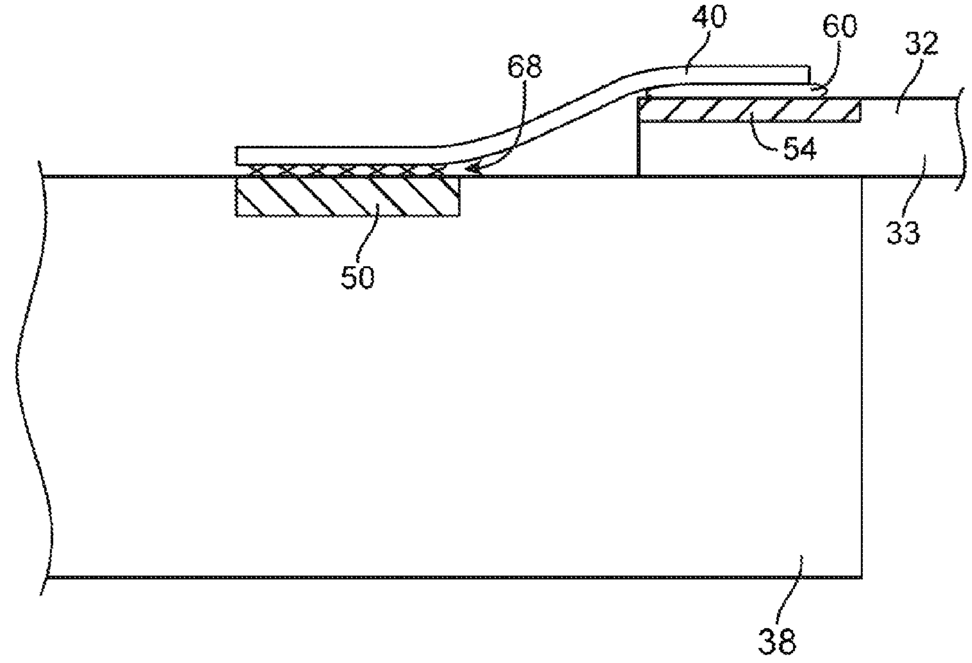
FIG. 11 is a cross-sectional side view of an illustrative flexible circuit attached to a printed circuit board using a conductive coupling member that is welded to the printed circuit board in accordance with an embodiment of the present invention.

A coupling member such as coupling member 40 that is connected to connectors 50 of PCB 38 using solder is merely illustrative. If desired, coupling member 40 may be attached to connectors 50 using any suitable coupling method. For example, coupling member 40 may be welded to connectors 50 using a weld such as weld 68 of FIG. 11.

Figure 12:
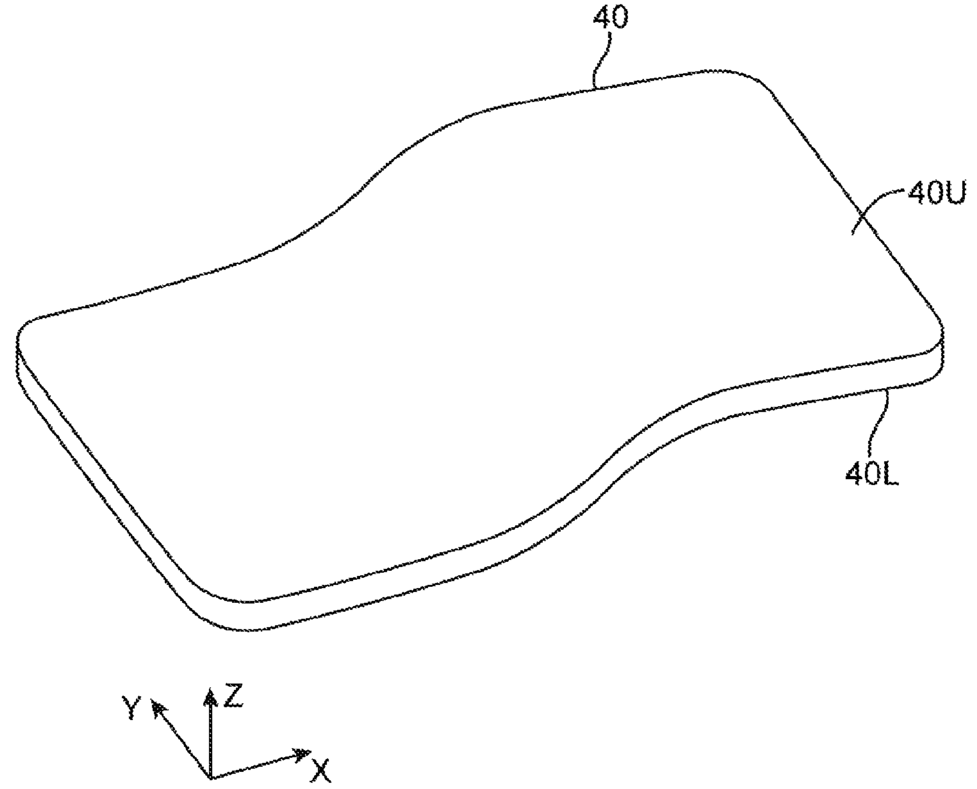
FIG. 12 is a perspective view of an illustrative conductive coupling member in accordance with an embodiment of the present invention.

FIG. 12 is a perspective view of coupling member 40 showing how coupling member 40 may be extended along a lateral dimension parallel to the y-axis of FIG. 12. Coupling member 40 may have a curved shape with one or more portions parallel to the x-y plane of FIG. 12 and a portion that is curved out of the x-y plane. Coupling member 40 may have an upper surface 40U and an opposing lower surface 40L. Lower surface 40L may be mounted in contact with PCB 38 and flexible circuit 32.

Figure 13:
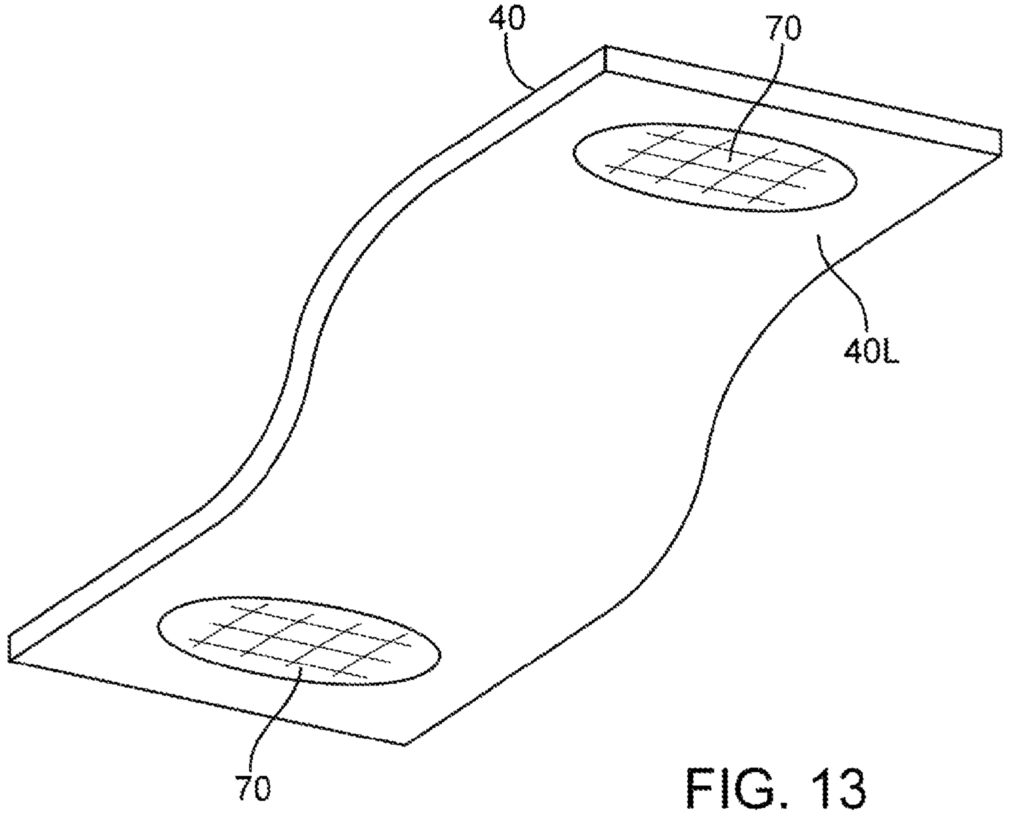
FIG. 13 is a perspective view of an illustrative conductive coupling member having a solder-philic coating in accordance with an embodiment of the present invention.

If desired, one or more portions of lower surface 40L of coupling member 40 may be provided with a coating such as coating 70 as shown in FIG. 13. Coating 70 may be a solder-philic coating formed from a metal such as gold, nickel, a gold-nickel alloy or other solder-philic material. Coating 70 may be configured so that when heat is applied to coupling member 40, coating 70 heats more efficiently than other portions of member 40 and solder wicks onto portions of bottom surface 40B that are coated with coating 70.

Figure 14:
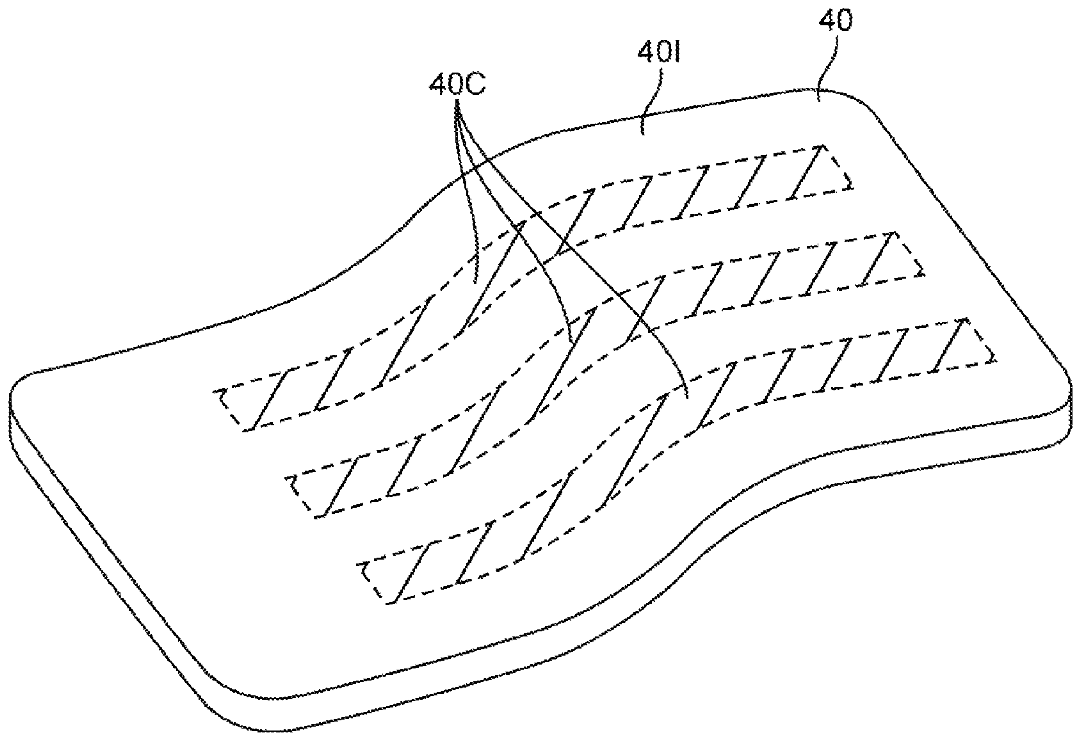
FIG. 14 is a perspective view of an illustrative conductive coupling member having non-conductive portions and conductive portions in accordance with an embodiment of the present invention.

If desired, coupling member 40 may be provided with conducting portions and non-conducting (insulating) portions. In the example of FIG. 14, coupling member 40 includes conducting portions 40C that form three conducting strips formed on (or embedded in) an insulating portion 40I. Conducting portions 40C may be formed from copper, aluminum, or other conducting material. Conducting portions 40C may include an additional coating formed from a conductive material such as gold, a gold-nickel alloy or other solder-philic coating. Insulating portion 40I may be formed from plastic, glass, ceramic, rubber, or other suitable insulating material. If desired, conducting portions may extend from an upper surface of coupling member 40 to an opposing lower surface of coupling member 40, or insulating portion 40I may be formed over conducting portions 40C so that conducting portions 40C are exposed on only a single (e.g., lower) surface of coupling member 40.

The three conducting (e.g., metal) strips 40C of FIG. 14 may be configured to connect three electrical contacts 54 in flexible circuit 32 to three respective electrical contacts 50 in PCB 38, as an example (as shown in, for example, FIG. 9). However, this is merely illustrative. If desired, coupling member 40 may include more than three conducting strips, less than three conducting strips, or may include conducting portions 40C having other shapes or configurations.

Figure 15:
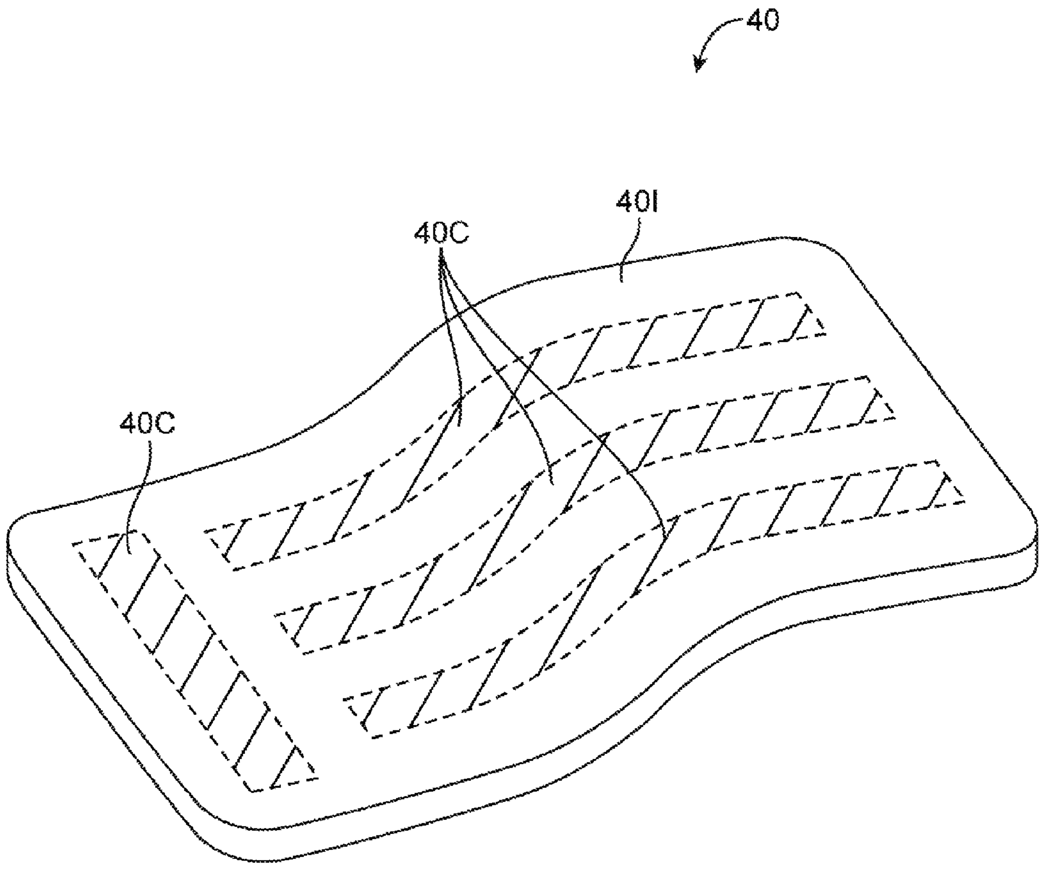
FIG. 15 is a perspective view of an illustrative conductive coupling member having a conductive portion for coupling to a ground contact in accordance with an embodiment of the present invention.

In the example of FIG. 15, coupling member 40 includes an additional conducting portion 40C at the base of coupling member 40. The additional conducting portion 40C may be connected (e.g., soldered, welded) to a conductor such as a ground conductor on a substrate such as PCB 38.

Figure 16:
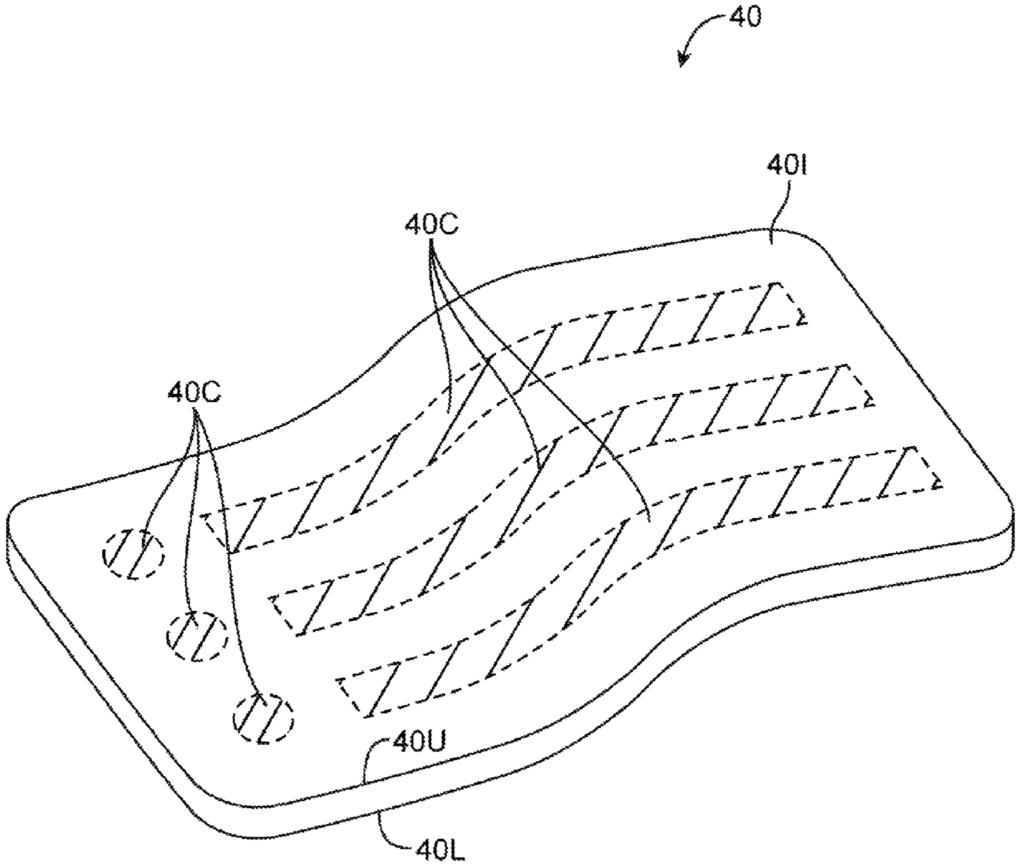
FIG. 16 is a perspective view of an illustrative conductive coupling member having protruding portions for engaging openings in a printed circuit board in accordance with an embodiment of the present invention.

As shown in FIG. 16, conducting portions 40C may include one or more round conducting portions 40C. Round conducting portions 40C may, if desired, contact a ground conductor on a substrate such as PCB 38. If desired, additional conducting portions 40C formed in insulating portion 40I may have any suitable shape and may include protrusions that extend from bottom surface 40B of coupling member 40.

Figure 17:
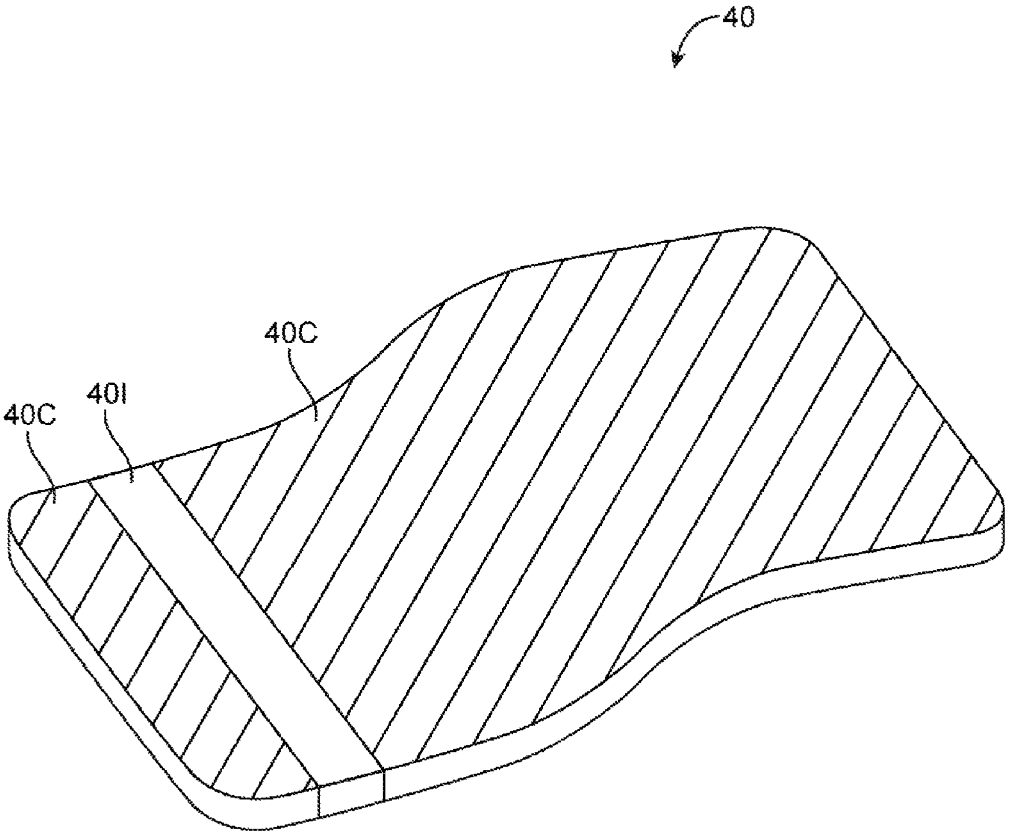
FIG. 17 is a perspective view of an illustrative conductive coupling member having non-conductive portions and conductive portions including a conductive portion for contacting a ground contact in accordance with an embodiment of the present invention.

As shown in FIG. 17, coupling member 40 may be formed from first and second extended conducting portions 40C that are separated by an insulating portion 40I that extends along a lateral dimension of coupling member 40. One of conducting portions 40C may be configured to connect electrical contacts 54 in flexible circuit 32 to respective electrical contacts 50 in PCB 38, as an example. Another conducting portion 40C may be connected (e.g., soldered, or welded) to a conducting pad such as a ground conductor on a substrate such as PCB 38 (as shown in, e.g., FIG. 5).

Figure 18:
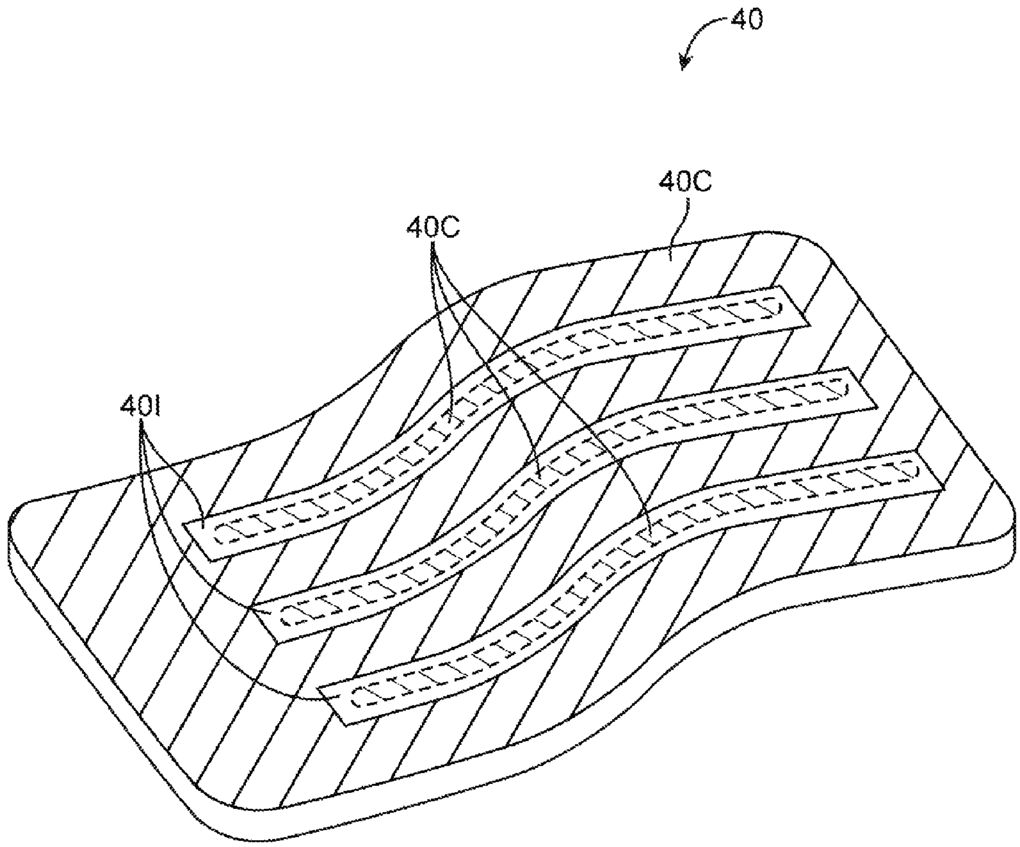
FIG. 18 is a perspective view of an illustrative conductive coupling member having non-conductive portions and conductive portions in accordance with an embodiment of the present invention.

As shown in FIG. 18, coupling member 40 may be formed from a conducting material such as metal having one or more conductive strips 40C that are embedded in insulating strips 40I in the conducting material.

Each strip 40C may be configured to connect one of electrical contacts 54 in flexible circuit 32 to a respective one of electrical contacts 50 in PCB 38, as an example. Another conducting portion 40C may be connected (e.g., soldered, or welded) to a conducting pad such as a ground conductor on a substrate such as PCB 38.

Figure 19:
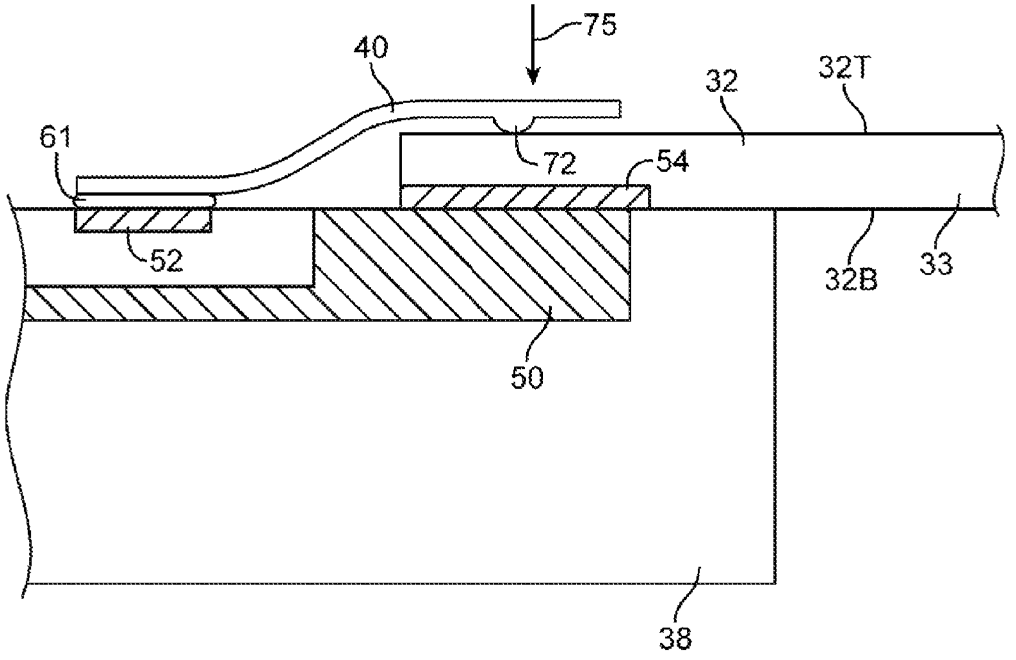
FIG. 19 is cross-sectional side view of an illustrative flexible circuit attached to a printed circuit board using a conductive coupling member having bumps that exert a force on the flexible circuit in accordance with an embodiment of the present invention.

The examples of FIGS. 6, 7, 8, 9, 10, and 11 in which contacts 54 of flexible circuit 32 are formed on top surface 32T of flexible circuit 32 are merely illustrative. As shown in FIG. 19, contacts 54 of flexible circuit 32 may be formed on an opposing bottom surface (e.g., bottom surface 32B) of flexible circuit 32. Contacts 54 may rest against contacts 50 of rigid printed circuit 38. Coupling member 40 may be configured to bear against top surface 32T of flexible circuit 32 (in direction 75) so that contacts 54 are pressed against contacts 50.

A first portion of coupling member 40 may bear against flexible circuit 32 and a second portion of coupling member 40 may be attached to a contact pad such as ground contact 52. As shown in FIG. 19, coupling member 40 may be attached to ground contact 52 using solder 61.

The portion of coupling member 40 that bears against flexible circuit 32 may, if desired, include extrusions such as bumps 72 for pressing flexible circuit 32 against rigid printed circuit 38. Bumps 72 may, for example, be formed from dimples in coupling member 40.

Figure 20:
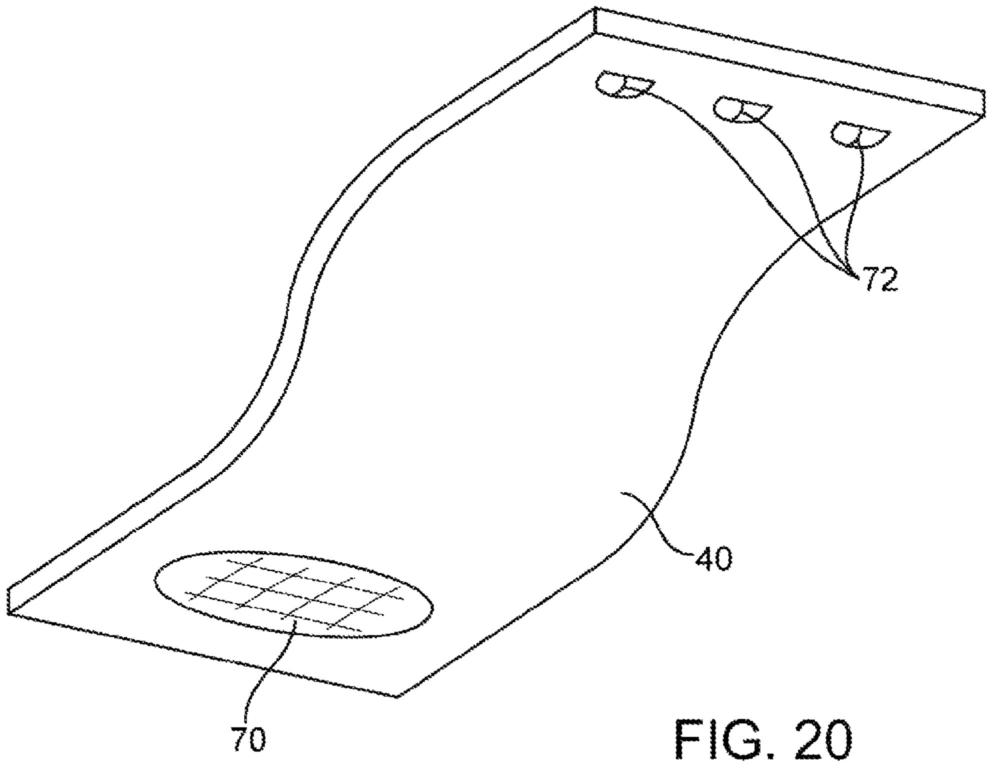
FIG. 20 is a perspective view of an illustrative conductive coupling member having a solder-philic coating and bumps in accordance with an embodiment of the present invention.

Bumps 72 may be formed from conducting or insulating materials. In the configuration of FIG. 20, bumps 72 may be formed from conducting or insulating material and may be configured to bear against an insulating upper surface (e.g., a coverlay that forms a potion of surface 32T). However, this is merely illustrative. If desired, bumps 72 may be formed from conducting material (e.g., copper, aluminum, etc.) and each bump 72 may be configured to form a conductive contact with a corresponding one of electrical contacts 54 (e.g., electrical contacts 54 on a top surface of flexible circuit 32 as in the configuration of, for example, FIG. 9).

As shown in FIG. 20, coupling member 40 may include one or more bumps 72 and a solder-philic coating (e.g., a gold coating). Coupling member 40 may include three bumps 72 for pressing three contacts 54 against three contacts 50 of rigid printed circuit 38. However, this is merely illustrative. Coupling member 40 may include less than three bumps, no bumps, four bumps, or more than four bumps. Flexible circuit 32 and rigid printed circuit 38 may each include less than three contacts, four contacts, or more than four contacts.

Figure 21:
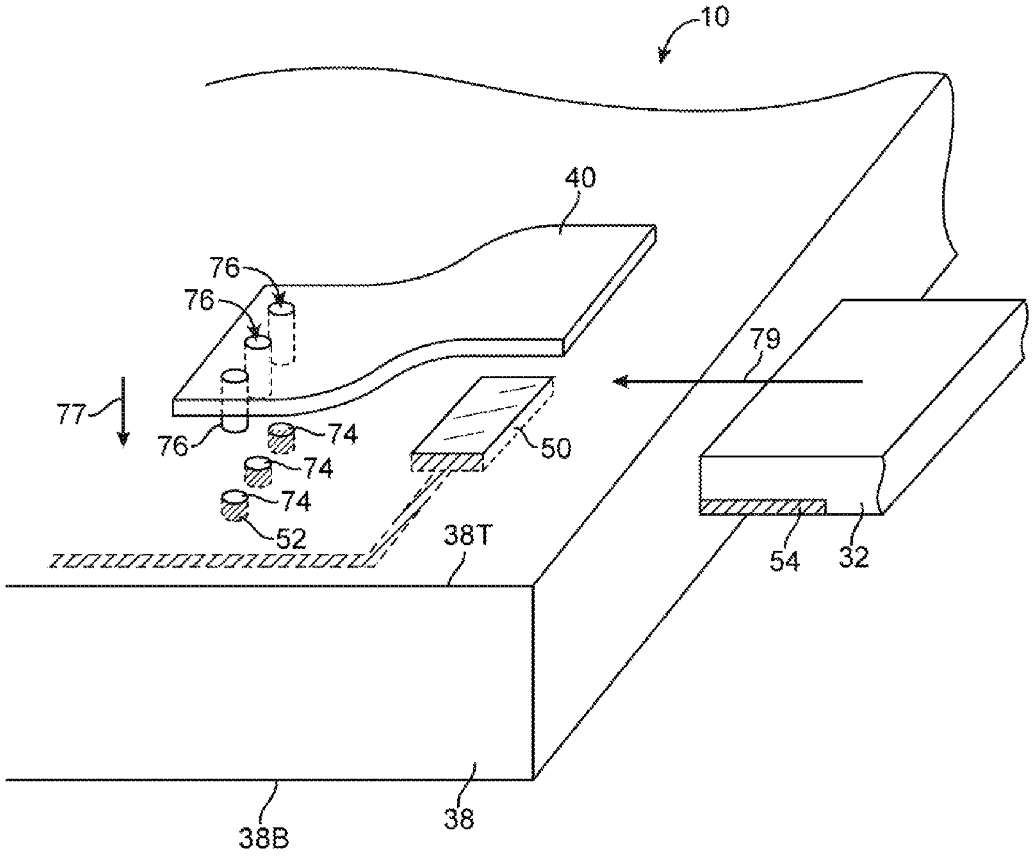
FIG. 21 is a perspective view of illustrative circuitry in an electronic device during assembly showing how protrusions on a coupling member may be inserted into openings in a printed circuit board before flexible circuitry is inserted into a space between the coupling member and the printed circuit board in accordance with an embodiment of the present invention.

As shown in FIG. 21, PCB 38 may include one or more holes such as openings 74. Openings 74 may be formed in a top surface such as top surface 38T of PCB 38. If desired, openings 74 may extend from top surface 38T of PCB 38 an opposing bottom surface such as bottom surface 38B of PCB 38. Coupling member 40 may include one or more protruding portions such as protrusions (sometimes called protruding members) 76. Protrusions 76 may be configured to engage openings 74. Openings 74 may include a conductive contact such as a ground contact 52 or other contact pad. Protrusions 76 may be formed from conductive material (e.g., metal) or may include a conductive coating. However, this is merely illustrative. If desired, openings 74 may be non-conductive openings and protrusions 76 may be non-conductive protrusions.

During assembly of device 10, protruding members 76 of coupling member 40 may be inserted into openings 74 on surface 38T of PCB 38 (as indicated by arrow 77). As shown in FIG. 21, coupling member 40 may be curved so that when protrusions 76 are mounted in openings 74, a space between coupling member 40 and surface 38T of PCB 38 may be formed. Flexible circuit 32 may be inserted into the space between coupling member 40 and surface 38T (as indicated by arrow 79) so that contacts 54 rest against contacts 50.

Figure 22:
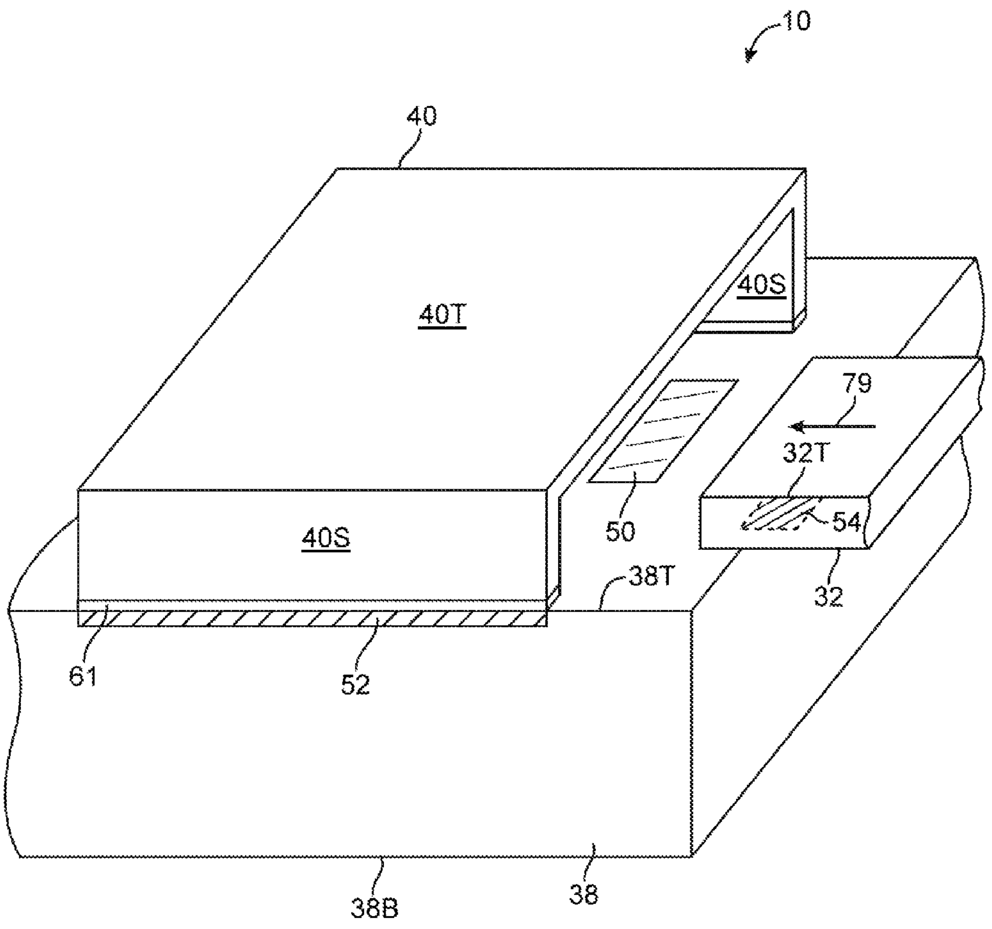
FIG. 22 is a perspective view of illustrative circuitry in an electronic device during assembly showing how a coupling member having sidewalls may be attached to a printed circuit board before flexible circuitry is inserted into a space between the coupling member and the printed circuit board in accordance with an embodiment of the present invention.

If desired, coupling member 40 may include a top portion such as portion 40T that is parallel to surface 38T of PCB 38 and sidewall portions such as portions 40S as shown in FIG. 22. Top portion 40T may bear against a top surface such as surface 32T of flexible circuit 32. Sidewall portions 40S may be attached to PCB 38. If desired, sidewall portions 40S may be attached to one or more ground contacts 52 using solder 61.

During assembly of device 10, coupling member 40 may be attached to ground contacts 52 and flexible circuit 32 may be inserted under top portion 40T so that contacts 54 couple to contacts 50 on PCB 38. In the example of FIG. 22, sidewall portions 40S are substantially perpendicular to top portion 40T. However this is merely illustrative.

Figure 23:
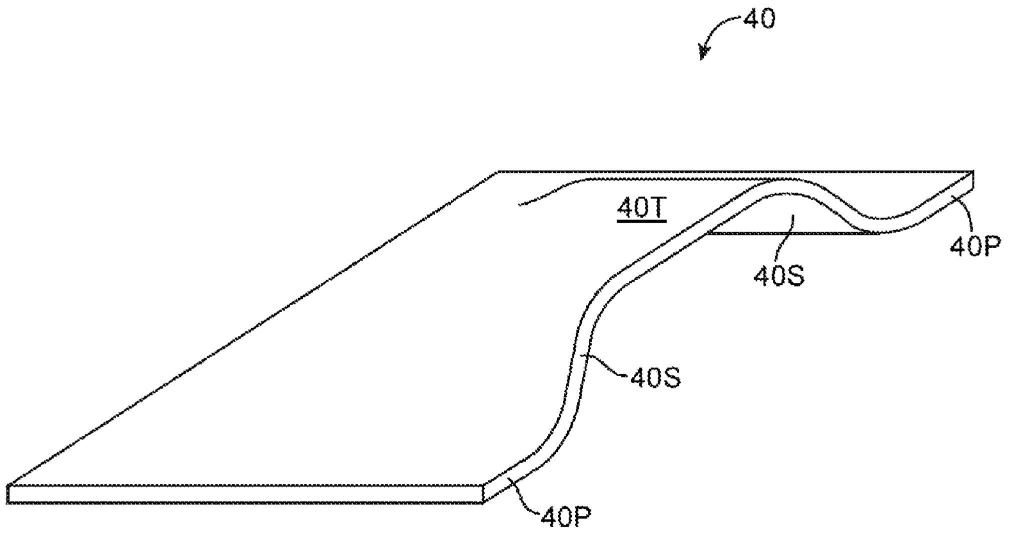
FIG. 23 is a perspective view of an illustrative coupling member having sidewalls and planar portions in accordance with an embodiment of the present invention.

As shown in FIG. 23, sidewall portions 40S may have a curved shape that extends from top portion 40T to a planar portion 40P. Portions 40T, 40S, and 40P of coupling member 40 may be formed from a conducting material such as metal (e.g., copper, aluminum, etc.) or may be formed from an insulating material (e.g., glass, plastic, etc.) having embedded or overmolded conductive portions. Planar portion 40P may, if desired, be attached to surface 38T of PCB 38 as shown in the top view of FIG. 24.

Figure 24:
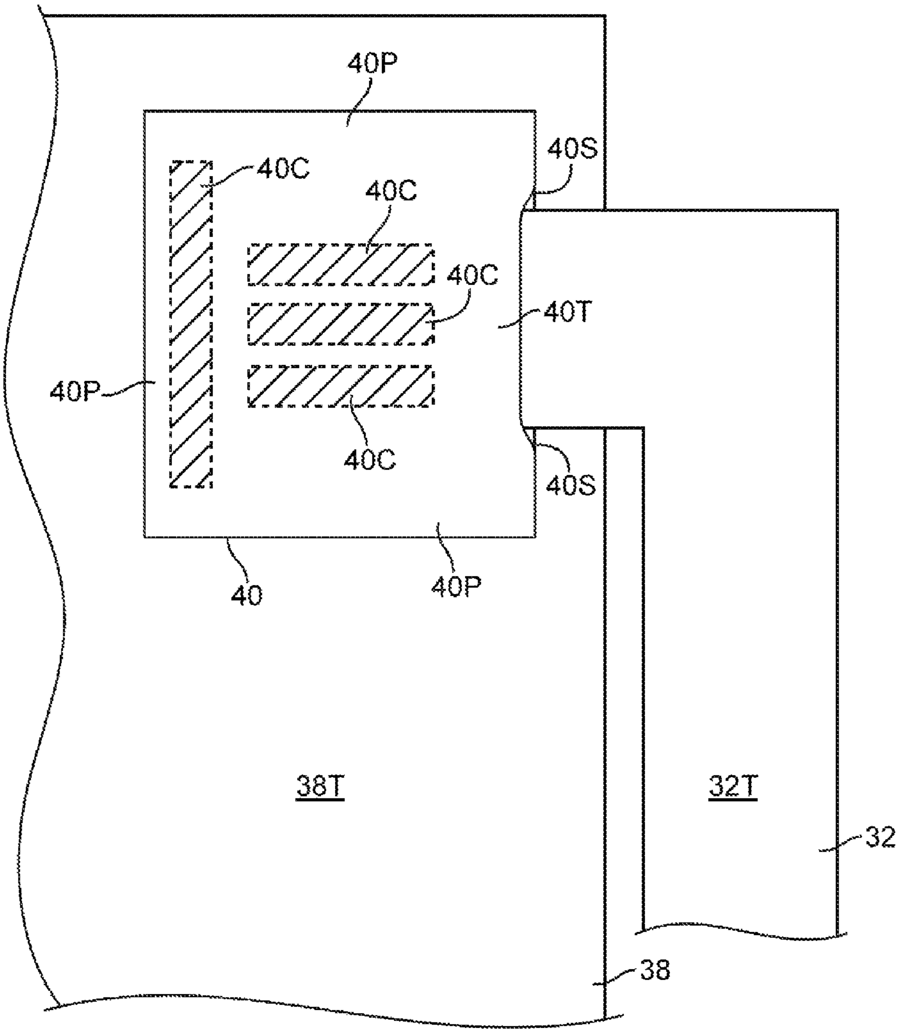
FIG. 24 is a top view of illustrative circuitry in an electronic device showing how a coupling member having a sidewalls and planar portions may include conductive portions for contacting a ground contact and conductive portions for electrically coupling flexible circuitry to the printed circuit board in accordance with an embodiment of the present invention.

In the example of FIG. 24, planar portions 40P are attached to top surface 38T of PCB 38 so that flexible circuit 32 may be attached to PCB 38 under top portion 40T of coupling member 40. If desired, coupling member 40 may include conductive portions 40C and insulating portions 40I. One of conductive portions 40C on planar portions 40P may be attached to a ground contact on PCB 38. Conductive portions 40C that extend from top portion 40T to planar portions 40P may include conductive strips for coupling contacts such as contacts 54 on top surface 32T of flexible circuit 32 to contacts such as contacts 50 on top surface 38T of PCB 38. However, this is merely illustrative. If desired, portions 40T, 40S and 40P of coupling member 40 may be substantially all conductive and top portion 40T may be configured to bear against top surface 32T of flexible circuit 32 so that contacts such as contacts 54 on a bottom surface of flexible circuit 32 rest against contacts such as contacts 50 on top surface 38T of PCB 38.

Figure 25:
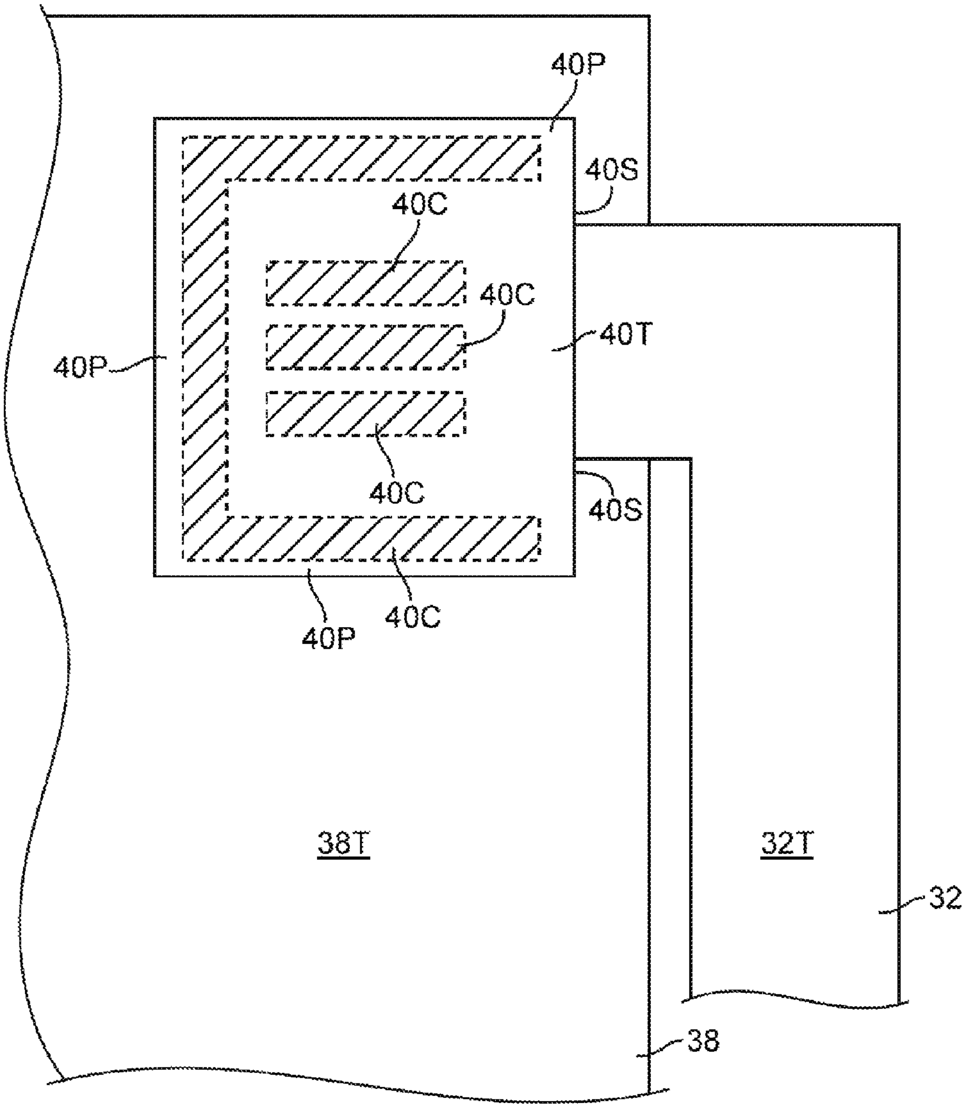
FIG. 25 is a top view of illustrative circuitry in an electronic device showing how a coupling member having sidewalls and planar portions may include conductive portions for contacting a ground contact that extend along multiple edges of the coupling member in accordance with an embodiment of the present invention.

As shown in FIG. 25, conductive portions 40C may include a conductive portion 40C that extends along more than one (e.g., all three) edges of planar portions 40P coupling member 40.

Figure 26:
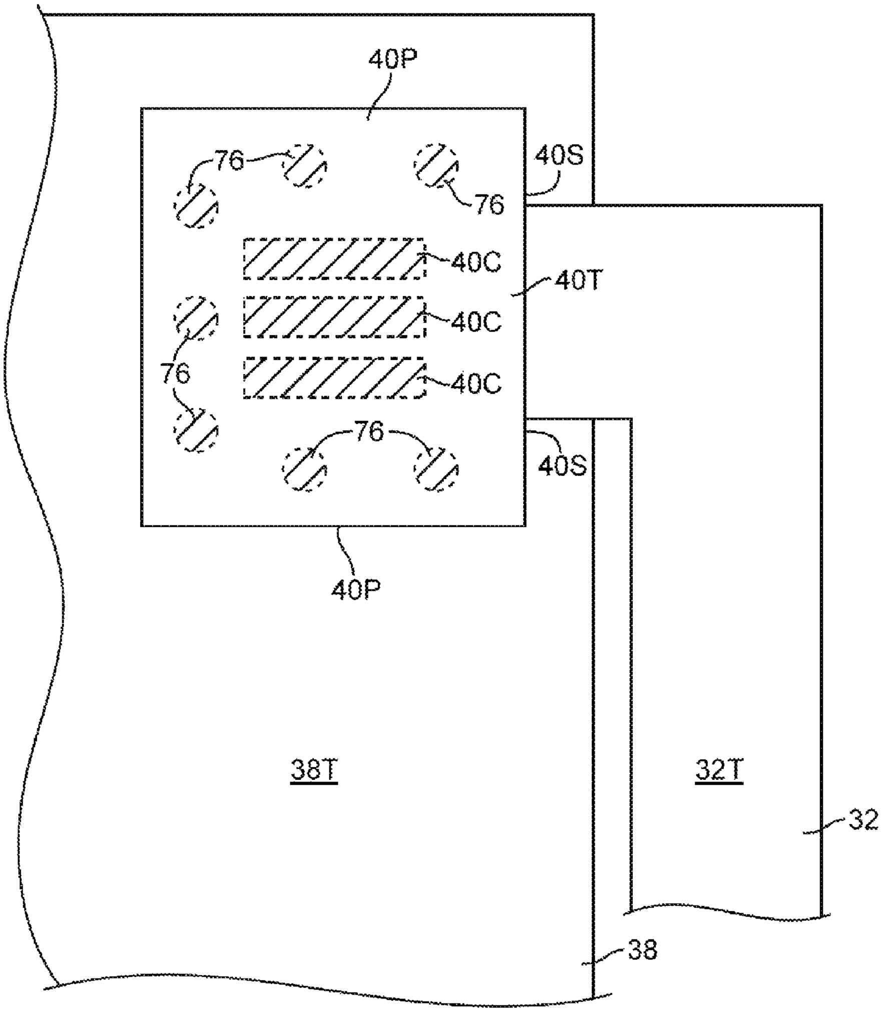
FIG. 26 is a top view of illustrative circuitry in an electronic device showing how a coupling member having sidewalls and planar portions may include protrusions for engaging openings in a printed circuit board in accordance with an embodiment of the present invention.

As shown in FIG. 26, planar portions 40P of coupling member 40 may include one or more protruding members such as protrusions 76 that engage openings in surface 38T of PCB 38. Protrusions 76 may include conductive protrusions that couple to electrical contacts in openings in PCB 38 or may include non-conductive protrusions that attach member 40 to PCB 38.

Figure 27:
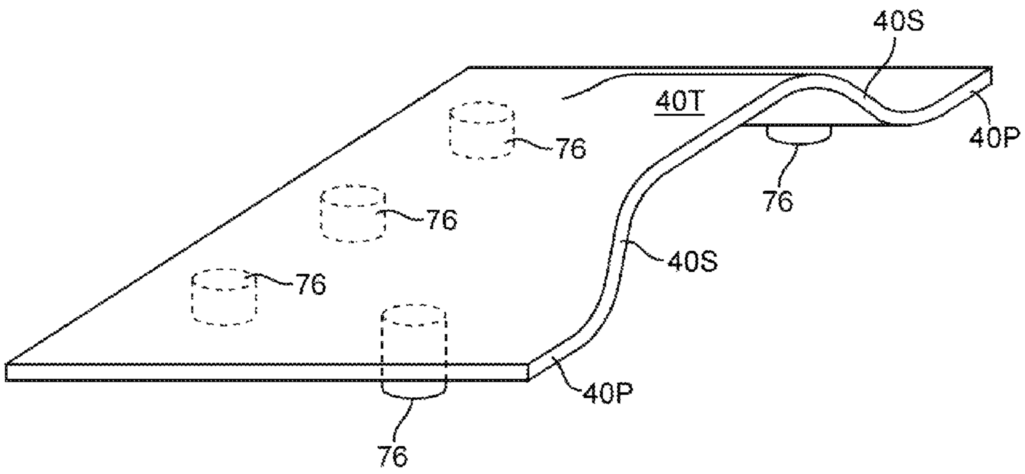
FIG. 27 is a cross-sectional side view of an illustrative coupling member having protrusions on planar portions for engaging openings in a printed circuit board in accordance with an embodiment of the present invention.

As shown in FIG. 27, protrusions 76 may extend from planar portions 40P of coupling member 40. If desired, some of protrusions 76 may conductively couple member 40 to PCB 38 and some protrusions 76 may be non-conductive protrusions that non-conductively engage openings in PCB 38. However, this is merely illustrative. If desired, all of protrusions 76 may be conductive or all of protrusions 76 may be non-conductive.

Figure 28:
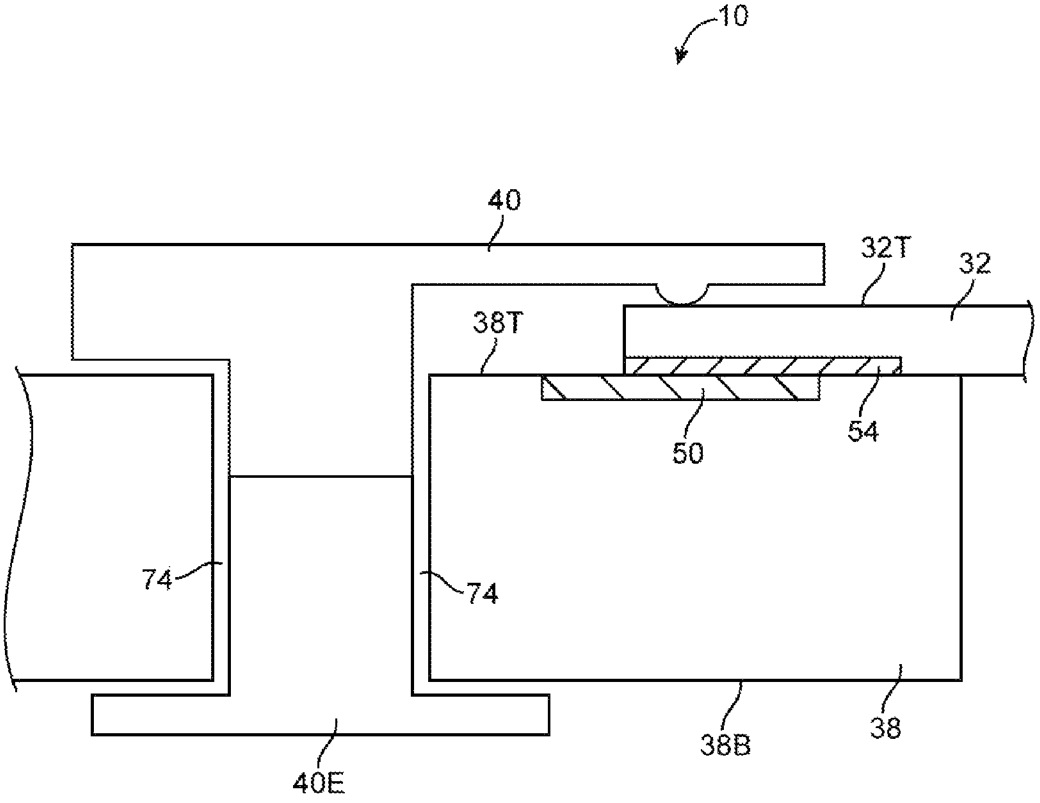
FIG. 28 is a cross-sectional side view of an illustrative coupling member having multiple engaging portions in an opening in a printed circuit board in accordance with an embodiment of the present invention.

As shown in FIG. 28, openings 74 may, if desired, extend from top surface 38T through to bottom surface 38B of PCB 38. Coupling member 40 may be engaged with an engagement member such as engagement member 40E in opening 74. Engagement member 40E may include a mating recess for mating with coupling member 40 or coupling member 40 and engagement member 40E may be screwed, snapped, glued or otherwise engaged within opening 74 (e.g., using screws or other fasteners, clips, grooves, and other engagement features, glue, welds, or other suitable attachment mechanisms).

During assembly of device 10, contacts 54 of flexible circuit 32 may be placed in contact with contacts 50 of PCB 38 and coupling member 40 may be attached to engagement member 40E in opening 74 so that coupling member 40 holds contacts 54 in contact with contacts 50.

Figure 29:
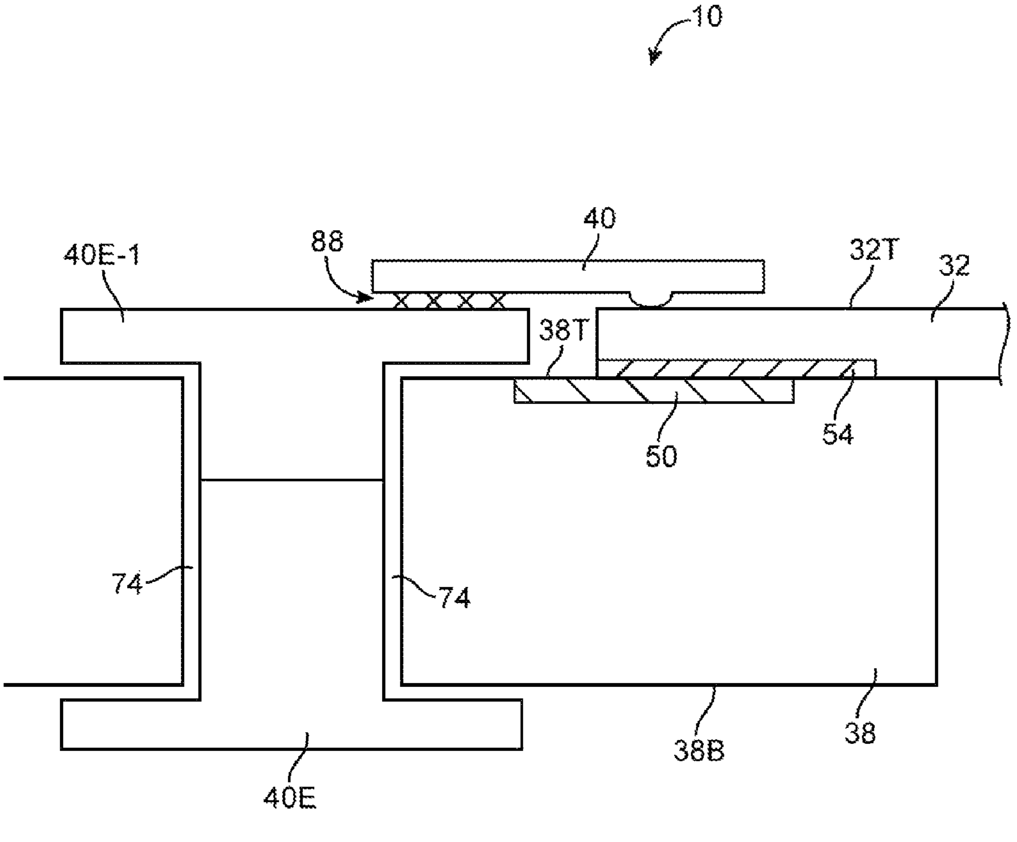
FIG. 29 is a cross-sectional side view of an illustrative coupling member that is welded to multiple engaging portions in an opening in a printed circuit board in accordance with an embodiment of the present invention.

As shown in FIG. 29, engagement member 40E may be attached to a second engagement member 40E-1 in opening 74. In configurations in which engagement member 40 is attached to a second engagement member 40E-1 in opening 74, coupling member 40 may be attached to second engagement member 40E-1 using, for example, weld 88. Engagement member 40E may be screwed, snapped, glued or otherwise engaged with second engagement member 40E in opening 74. Engagement member 40E-1 may be screwed, snapped, glued, welded or otherwise attached to coupling member 40 so that coupling member 40 bears against top surface 32T of flexible circuit 32.

Figure 30A:
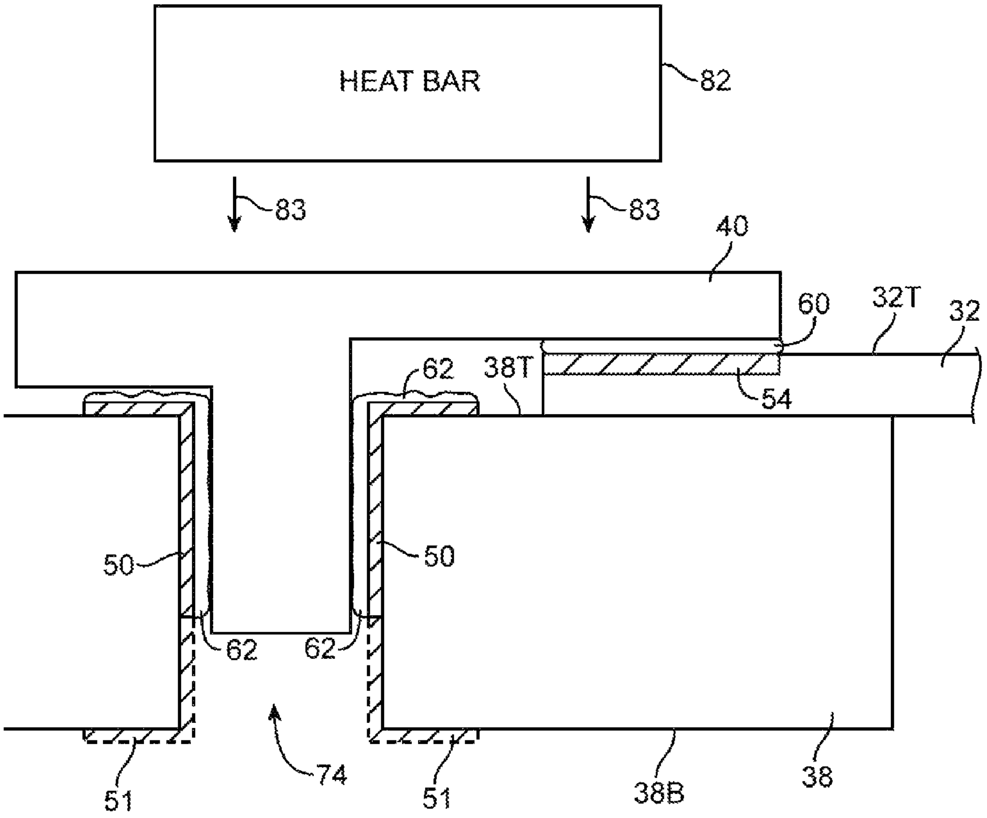
FIG. 30A is a cross-sectional side view of an illustrative coupling member engaged in a plated through hole in a printed circuit board showing how a heat bar may be used to reflow solder for attaching flexible circuitry to the coupling member in accordance with an embodiment of the present invention.

If desired, electrical contacts 50 of PCB 38 may be partially or completely formed within openings 74. As shown in FIG. 30A, coupling member 40 may be electrically coupled to contacts 50 in opening 74 using, for example, solder 62. As indicated in FIG. 30A, contacts 50 may be formed on a portion of the surface of opening 74 or may include extended portions 51 that extend along the length of opening 74 and, if desired, onto surface 38B of PCB 38. Solder 62 may wick onto portions of contacts 50 that extend onto surfaces 38T and/or 38B or solder 62 may be configured to remain within opening 74.

In the example of FIG. 30A, coupling member 40 extends only partially into opening 74. However, this is merely illustrative. Coupling member 40 may, if desired, extend along the full length of opening 74 (e.g., coupling member 40 may extend to surface 38B of PCB 38.

During assembly of device 10, a heated bonding tool such as heat bar 82 may be used to reflow solder such as solder 60 and 62 in order to connect coupling member 40 to contacts 50 and contacts 54. If desired, solder 62 may have a first reflow temperature and solder 60 may have a second reflow temperature that is less than the first reflow temperature of solder 62. Coupling member 40 may be soldered to contacts 50 in openings 74 using heat bar 82 at the first temperature (e.g., by heating heat bar 82 to the first temperature and temporarily pressing heat bar 82 against coupling member 40 as indicated by arrows 83). Contacts 54 on flexible circuit 32 may then be soldered to coupling member 40 using heat bar 82 at the lower, second temperature (e.g., by heating heat bar 82 to the second temperature and temporarily pressing heat bar 82 against coupling member 40 as indicated by arrows 83) so that solder 62 remains fixed. However, this is merely illustrative. If desired, coupling member 40 may be soldered to flexible circuit 32 and later soldered into opening 74 using heat bar 82 (i.e., solder 62 may, if desired, have a reflow temperature that is less than the reflow temperature of solder 60).

Figure 30B:
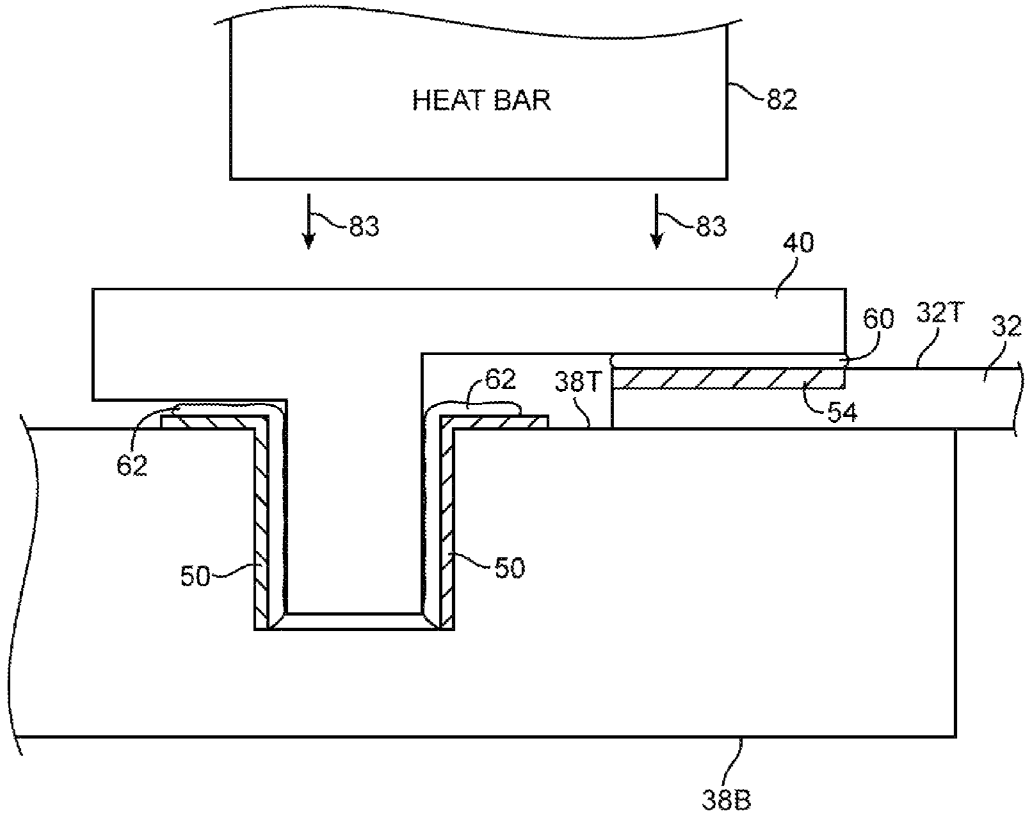
FIG. 30B is a cross-sectional side view of an illustrative coupling member engaged in a plated opening in a printed circuit board showing how a heat bar may be used to reflow solder for attaching flexible circuitry to the coupling member in accordance with an embodiment of the present invention.

In the example of FIG. 30A, opening 74 extends from surface 38T to surface 38B of PCB 38. However, this is merely illustrative. If desired, opening 74 may extend only partially into PCB 38, as shown in FIG. 30B.

Figure 31A:
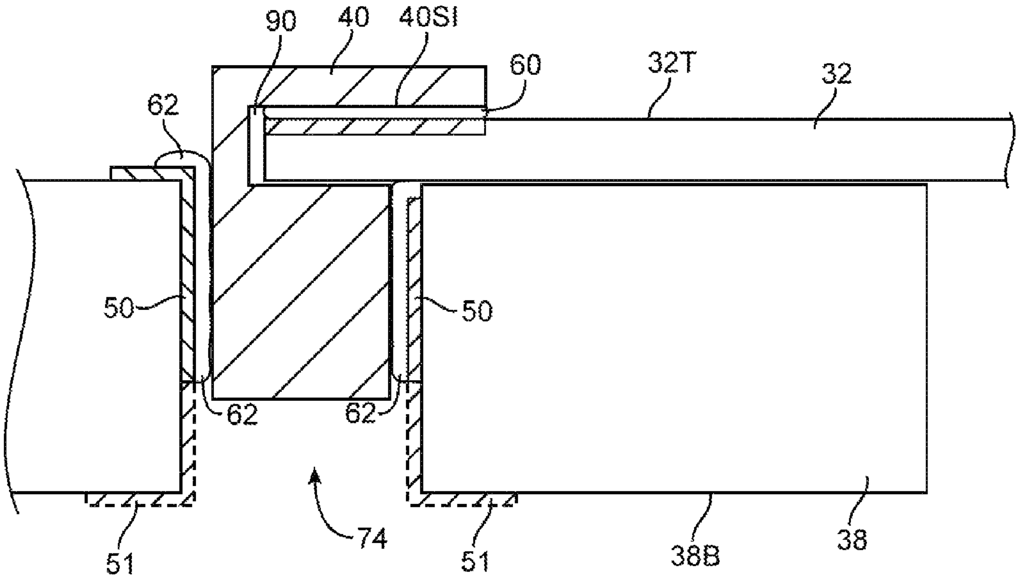
FIG. 31A is a cross-sectional side view of an illustrative coupling member engaged in a plated opening in a printed circuit board and having a recess for attaching flexible circuitry to the coupling member in accordance with an embodiment of the present invention.

If desired, coupling member 40 may include a recess such as recess 90 as shown in FIG. 31A. Flexible circuit 32 may be inserted into recess 90 in coupling member 40 that has been soldered to contacts 50 in openings 74. Contacts 54 on flexible circuit 32 may be soldered to a conductive surface such as surface 40SI in recess 90.

As indicated in FIG. 31A, contacts 50 may be formed on a portion of the surface of opening 74 or may include extended portions 51 that extend along the length of opening 74 and, if desired, onto surface 38B of PCB 38. Solder 62 may wick onto portions of contacts 50 that extend onto surfaces 38T and/or 38B or solder 62 may be configured to remain within opening 74.

In the example of FIG. 31A, coupling member 40 having recess 90 extends only partially into opening 74. However, this is merely illustrative. Coupling member 40 may, if desired, extend along the full length of opening 74 (e.g., coupling member 40 may extend to surface 38B of PCB 38.

Figure 31B:
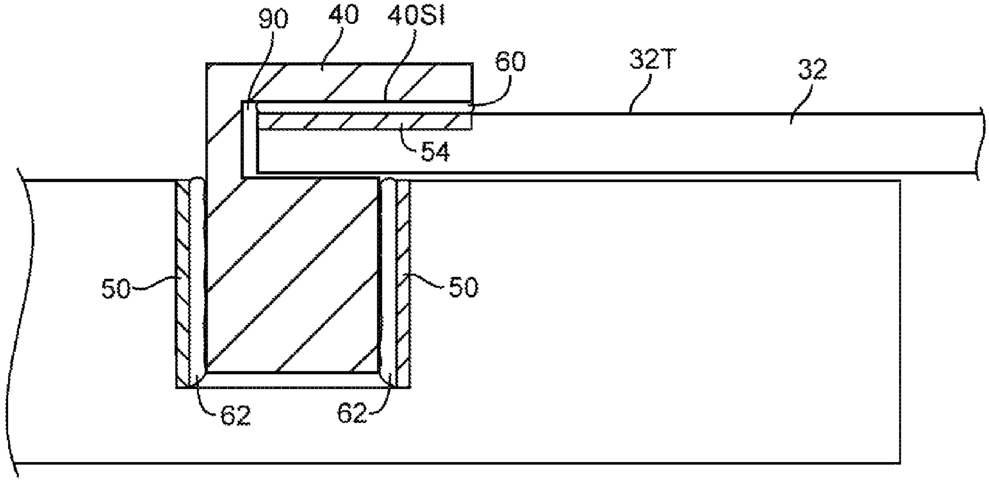
FIG. 31B is a cross-sectional side view of an illustrative coupling member engaged in a plated opening in a printed circuit board and having a recess for attaching flexible circuitry to the coupling member in accordance with an embodiment of the present invention.

In the example of FIG. 31A, opening 74 extends from surface 38T to surface 38B of PCB 38. However, this is merely illustrative. If desired, opening 74 may extend only partially into PCB 38 from surface 38T as shown in FIG. 31B.

Figure 32:
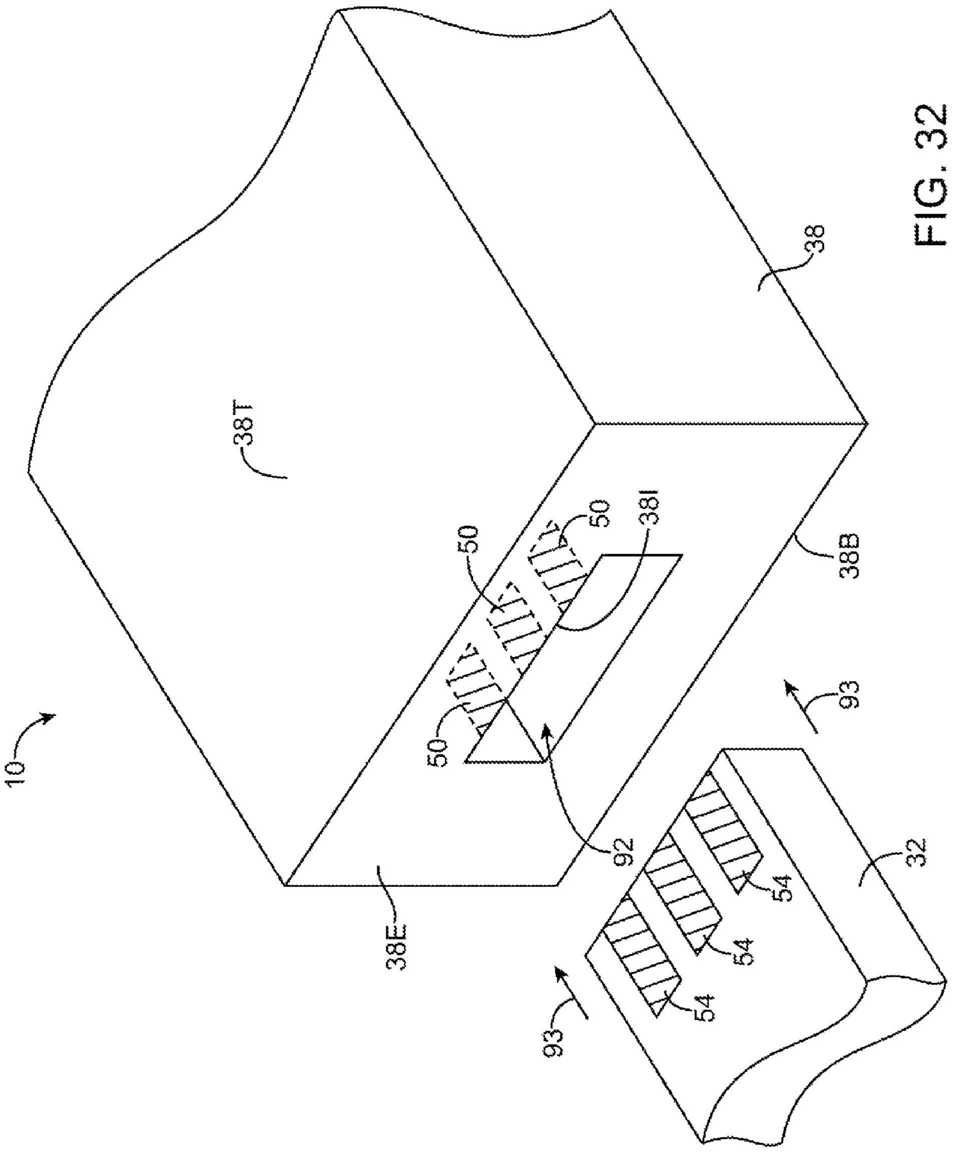
FIG. 32 is a perspective view of illustrative circuitry in an electronic device showing how flexible circuitry may be inserted into a recess in an edge of a printed circuit board in accordance with an embodiment of the present invention.

The examples of FIGS. 1-29, 30A, 30B, 31A, and 31B in which contacts 50 of PCB 38 are formed on an outer surface (e.g., surface 38T) of PCB 38 are merely illustrative. As shown in FIG. 32, if desired, contacts 50 may be formed in an interior surface such as surface 381 of a slot such as slot 92. Slot 92 may be formed in an edge such as edge 38E of PCB 38 so that flexible circuit 32 may be inserted into slot 92 during assembly of device 10 (in direction 93). Solder such as solder 60 (not shown) may be reflowed in to slot 92 after flexible circuit 32 has been inserted into slot 92 in order to couple contacts 54 of flexible circuit 32 to contacts 50 on interior surface 381 of PCB 38.

Figure 33:
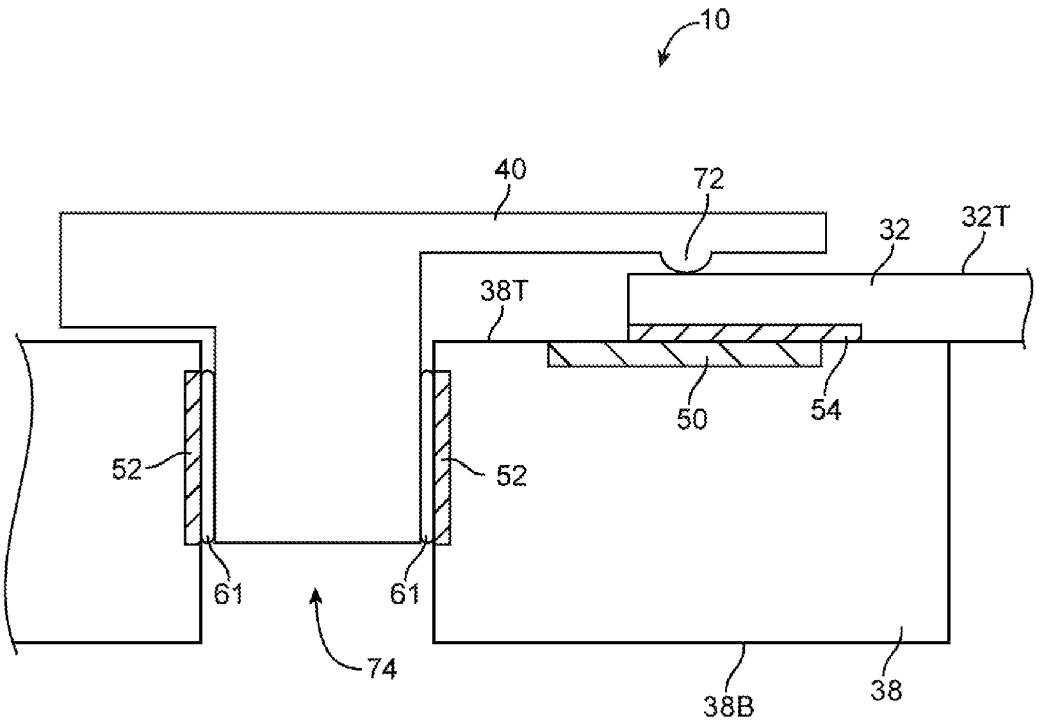
FIG. 33 is a cross-sectional side view of an illustrative coupling member that is attached in an opening in a printed circuit board using solder in accordance with an embodiment of the present invention.

As described above in connection with, e.g., FIG. 28, openings 74 may, if desired, extend from top surface 38T through to bottom surface 38B of PCB 38. Coupling member 40 may be engaged with in opening 74 using solder. In the example of FIG. 33, a coupling member having bumps 72 for pressing flexible circuit 32 against PCB 38 is soldered to ground contacts 52 in opening 74 using solder 61. In this way, coupling member 40 may be coupled to a ground plane in PCB 38.

Coupling member 40 of FIG. 33 may extend partially into opening 74 or may extend to surface 38B of PCB 38. Opening 74 may extend from top surface 38T through to bottom surface 38B or may extend only partially from surface 38T into PCB 38.

Figure 34:
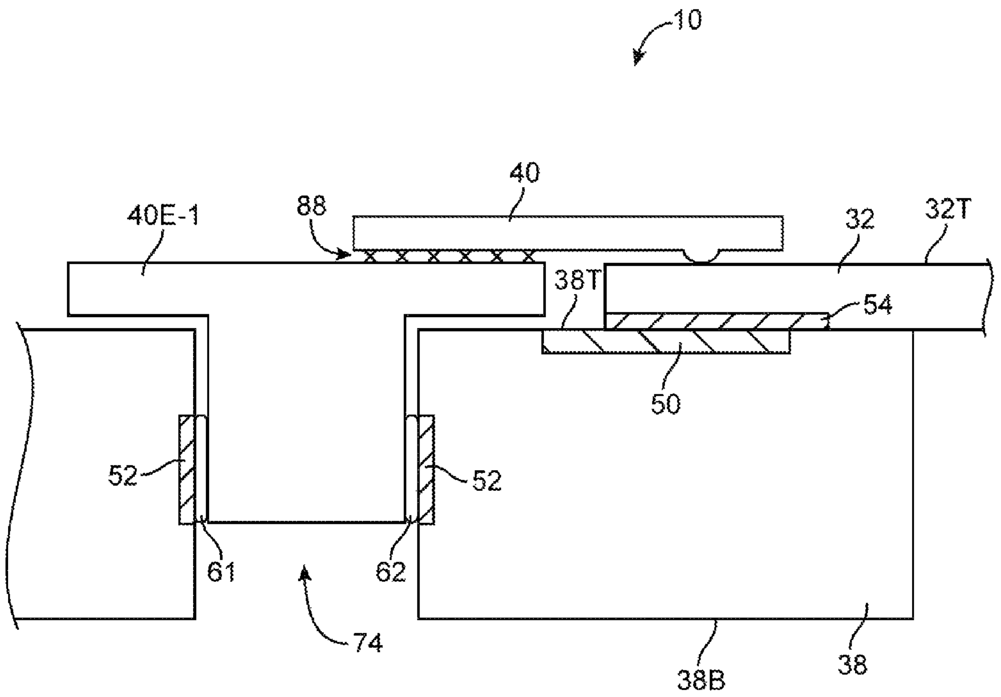
FIG. 34 is a cross-sectional side view of an illustrative coupling member that is welded to an engaging portion that is attached in an opening in a printed circuit board using solder in accordance with an embodiment of the present invention.

As shown in FIG. 34, a coupling member such as coupling member 40 having bumps 72 for pressing flexible circuit 32 against PCB 38 and that is soldered to ground contacts 52 in opening 74 using solder 61 may include an engagement member 40E-1 that is soldered to ground contacts 52 in opening 74 using solder 61. In configurations in which engagement member 40 is attached to engagement member 40E-1 in opening 74, coupling member 40 may be attached to engagement member 40E-1 using, for example, weld 88.

The foregoing is merely illustrative of the principles of this invention and various modifications can be made by those skilled in the art without departing from the scope and spirit of the invention.

What is claimed is:

1. Apparatus, comprising: a flexible printed circuit having opposing first and second surfaces and a contact pad on the first surface;

a rigid printed circuit having opposing first and second surfaces and a contact pad on and in contact with the first surface, wherein a portion of the second surface of the flexible printed circuit rests against a portion of the first surface of the rigid printed circuit; and an electrical coupling member having a first portion that is attached to the contact pad on the flexible printed circuit with solder and having a second portion that is electrically connected to the contact pad on the rigid printed circuit, wherein the electrical coupling member comprises a first metal portion, a second metal portion, and a dielectric portion that insulates the first metal portion from the second metal portion, and wherein the second metal portion is coupled to a ground structure on the rigid printed circuit.

2. The apparatus defined in claim 1 wherein the second portion of the electrical coupling member is attached to the contact pad on the rigid printed circuit by solder.

3. The apparatus defined in claim 2 further comprising a display, wherein the flexible printed circuit is coupled to the display.

4. The apparatus defined in claim 1 wherein the second portion of the electrical coupling member is soldered to the contact pad on the rigid printed circuit, wherein the solder with which the second portion of the electrical coupling member is soldered to the rigid printed circuit has a first reflow temperature, and wherein the solder with which the first portion of the electrical coupling member is soldered to the flexible printed circuit has a second reflow temperature that is less than the first reflow temperature.

5. The apparatus defined in claim 1 wherein the electrical coupling member comprises a solder-philic coating that covers at least some of the electrical coupling member.

6. The apparatus defined in claim 1 wherein the electrical coupling member comprises a strip of metal.

7. The apparatus defined in claim 1 wherein the first metal portion is coupled to the contact pad on the flexible printed circuit and the contact pad on the rigid printed circuit.

8. The apparatus defined in claim 1 wherein the electrical coupling member comprises a plurality of metal members embedded within an insulating structure.

9. Apparatus, comprising:

a flexible printed circuit having opposing first and second surfaces and a contact pad on the first surface;

a rigid printed circuit board having opposing first and second surfaces and a contact pad on and in contact with the first surface, wherein the contact pad on the first surface of the flexible printed circuit rests against the contact pad on the first surface of the rigid printed circuit board; and a coupling member that presses the first surface of the flexible printed circuit against the first surface of the rigid printed circuit board, wherein the coupling member comprises a metal member that has a first portion that is attached to the first surface of the rigid printed circuit board and that has a second portion that bears against the second surface of the flexible printed circuit, wherein the rigid printed circuit board has at least one opening, wherein the first portion of the coupling member includes a protruding portion that extends into the at least one opening, wherein the protruding portion comprises a metal protruding portion, and wherein the rigid printed circuit board includes a ground contact in the at least one opening that is coupled to the metal protruding portion.

10. The apparatus defined in claim 9 wherein the first portion of the metal member is soldered to an additional contact pad on the first surface of the rigid printed circuit board.

11. The apparatus defined in claim 9 further comprising a display, wherein the flexible printed circuit is electrically coupled between the rigid printed circuit board and the display.

12. The apparatus defined in claim 9 wherein the opening extends from the first surface to the second surface of the rigid printed circuit board, the apparatus further comprising an engagement member that engages the coupling member in the at least one opening.

13. The apparatus defined in claim 9 wherein the opening extends from the first surface to the second surface of the rigid printed circuit board, the apparatus further comprising first and second engagement members, wherein the second engagement member engages the first engagement member in the at least one opening and wherein the coupling member is welded to the first engagement member.

14. The apparatus defined in claim 9 wherein the coupling member has a top portion and sidewalls attached to the top portion, wherein the second portion that bears against the second surface of the flexible printed circuit comprises the top portion and wherein the sidewalls are attached to the rigid printed circuit board.

15. The apparatus defined in claim 14 wherein the sidewalls are coupled to the ground contact on the rigid printed circuit board.

16. The apparatus defined in claim 15 wherein the coupling member further comprises planar portions that are parallel to the top portion and are attached to the sidewalls, wherein the planar portions rest against the first surface of the rigid printed circuit board.

17. The apparatus defined in claim 16 wherein the planar portions have protruding members, wherein the rigid printed circuit board comprises openings in the first surface and wherein the protruding members extend into the openings.

18. Apparatus, comprising:

a flexible printed circuit having opposing first and second surfaces and a contact pad on the first surface;

a rigid printed circuit having opposing first and second surfaces and a contact pad on and in contact with the first surface and having a recess in the first surface that receives a portion of the flexible printed circuit; and an electrical coupling member that has a first portion that is coupled to the contact pad on the first surface of the rigid printed circuit and having second portion that is coupled to the contact pad on the first surface of the flexible printed circuit, wherein the first surface of the flexible printed circuit lies in a common plane with the first surface of the rigid printed circuit.

19. The apparatus defined in claim 18 wherein the electrical coupling member comprises a metal member, wherein the first portion is soldered to the contact pad on the first surface of the rigid printed circuit, and wherein the second portion is soldered to the contact pad on the first surface of the flexible printed circuit.

20. The apparatus defined in claim 18 further comprising a recess in the second surface of the flexible printed circuit that mates with the recess in the first surface of the rigid printed circuit board.

21. Apparatus, comprising:

a flexible printed circuit having opposing first and second surfaces and a contact pad on the first surface;

a rigid printed circuit board having opposing first and second surfaces and a contact pad in an opening that extends from the first surface of the rigid printed circuit board to the second surface of the rigid printed circuit board, wherein a portion of the second surface of the flexible printed circuit rests against a portion of the first surface of the rigid printed circuit board, wherein the first surface of the rigid printed circuit board comprises a top surface of the rigid printed circuit board, and wherein the second surface of the rigid printed circuit comprises a bottom surface of the rigid printed circuit board; and an electrical coupling member having a first portion that is coupled to the contact pad on the flexible printed circuit with solder and having a second portion that is soldered to the contact pad in the opening.

22. The apparatus defined in claim 21 wherein the first portion of the electrical coupling member comprises a surface in a recess in the electrical coupling member and wherein a portion of the second surface of the flexible printed circuit rests against an additional surface of the recess in the electrical coupling member.

* * * * *

UNITED STATES PATENT AND TRADEMARK OFFICE

CERTIFICATE OF CORRECTION

PATENT NO. : 8,923,003 B2
APPLICATION NO. : 13/367131
DATED : December 30, 2014
INVENTOR(S) : Alexander D. Schlaupitz et al.

It is certified that error appears in the above-identified patent and that said Letters Patent is hereby corrected as shown below:

In the Claims

In claim 18, column 18, line 23, delete “and having second portion that” and insert --and having a second portion that--.

Signed and Sealed this
Fourteenth Day of July, 2015

Michelle K. Lee
*Director of the United States Patent and Trademark Office*